(12) United States Patent
Aoki et al.

(10) Patent No.: US 9,633,848 B2
(45) Date of Patent: Apr. 25, 2017

(54) PHOTOSENSITIVE RESIN COMPOSITION, METHOD FOR PRODUCING PATTERNED CURED FILM, SEMICONDUCTOR ELEMENT AND ELECTRONIC DEVICE

(71) Applicant: HITACHI CHEMICAL COMPANY, LTD., Tokyo (JP)

(72) Inventors: Yu Aoki, Hitachi (JP); Shigeru Nobe, Hitachi (JP); Hiroshi Matsutani, Tsukuba (JP); Kei Kasuya, Hitachi (JP); Akitoshi Tanimoto, Hitachi (JP); Shingo Tahara, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/438,744

(22) PCT Filed: Oct. 9, 2013

(86) PCT No.: PCT/JP2013/077525
§ 371 (c)(1),
(2) Date: Apr. 27, 2015

(87) PCT Pub. No.: WO2014/069202
PCT Pub. Date: May 8, 2014

(65) Prior Publication Data
US 2015/0325431 A1   Nov. 12, 2015

(30) Foreign Application Priority Data

Oct. 31, 2012 (JP) .................................. 2012-240567
Dec. 26, 2012 (JP) .................................. 2012-282958

(51) Int. Cl.
*G03F 7/023* (2006.01)
*G03F 7/038* (2006.01)
(Continued)

(52) U.S. Cl.
CPC ............ *H01L 21/0274* (2013.01); *C08F 8/12* (2013.01); *C08F 12/22* (2013.01); *C08F 112/14* (2013.01);
(Continued)

(58) Field of Classification Search
None
See application file for complete search history.

(56) References Cited

U.S. PATENT DOCUMENTS 6,451,502 B1 * 9/2002 Ray .................... B41M 5/368
430/270.1
2004/0023151 A1   2/2004 Takeda et al.
(Continued)

FOREIGN PATENT DOCUMENTS

EP      1482360 A1    12/2004
JP   2003233185 A     8/2003
(Continued)

OTHER PUBLICATIONS

Decision to Grant a Patent mailed Dec. 9, 2014, for Japanese Application No. 2014-544405, together with English language translation thereof.
(Continued)

*Primary Examiner* — Martin Angerbranndt
(74) *Attorney, Agent, or Firm* — Fitch, Even, Tabin & Flannery, LLP

(57) ABSTRACT

Disclosed is a photosensitive resin composition comprising (A) an alkali-soluble resin having a structural unit represented by the following formula (1), (B) a compound that generates an acid by light, (C) a thermal crosslinking agent, and (D) an acryl resin having a structural unit represented by the following formula (2):

(Continued)

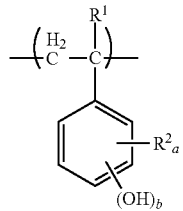

wherein $R^1$ represents a hydrogen atom or a methyl group; $R^2$ represents an alkyl group having 1 to 10 carbon atoms, or the like; and a represents an integer of 0 to 3, b represents an integer of 1 to 3, and the total of a and b is 5 or less, and

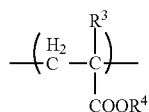

wherein $R^3$ represents a hydrogen atom or a methyl group; and $R^4$ represents a hydroxyalkyl group having 2 to 20 carbon atoms.

20 Claims, 7 Drawing Sheets

(51) Int. Cl.

| | | |
|---|---|---|
| G03F 7/40 | (2006.01) | |
| C09D 125/18 | (2006.01) | |
| C08F 8/12 | (2006.01) | |
| C08F 12/24 | (2006.01) | |
| C08F 220/34 | (2006.01) | |
| C08F 220/36 | (2006.01) | |
| H01L 51/00 | (2006.01) | |
| H01L 21/027 | (2006.01) | |
| H01L 21/02 | (2006.01) | |
| H01L 23/29 | (2006.01) | |
| H01L 23/31 | (2006.01) | |
| H01L 23/532 | (2006.01) | |
| C08F 212/14 | (2006.01) | |
| C08F 12/22 | (2006.01) | |
| C08F 112/14 | (2006.01) | |
| C08L 25/18 | (2006.01) | |
| H01L 23/00 | (2006.01) | |

(52) U.S. Cl.
CPC ............ *C08F 212/14* (2013.01); *C08L 25/18* (2013.01); *C09D 125/18* (2013.01); *G03F 7/0233* (2013.01); *G03F 7/038* (2013.01); *G03F 7/0388* (2013.01); *G03F 7/40* (2013.01); *H01L 21/02118* (2013.01); *H01L 23/293* (2013.01); *H01L 23/3114* (2013.01); *H01L 23/5329* (2013.01); *H01L 24/13* (2013.01); *H01L 2224/02125* (2013.01); *H01L 2224/0401* (2013.01); *H01L 2224/05008* (2013.01); *H01L 2224/05018* (2013.01); *H01L 2224/05022* (2013.01); *H01L 2224/05099* (2013.01); *H01L 2224/05124* (2013.01); *H01L 2224/05572* (2013.01); *H01L 2224/05599* (2013.01); *H01L 2224/10126* (2013.01); *H01L 2224/131* (2013.01); *H01L 2224/13022* (2013.01); *H01L 2224/2919* (2013.01); *H01L 2224/73104* (2013.01)

(56) References Cited

U.S. PATENT DOCUMENTS

| | | | |
|---|---|---|---|
| 2004/0126696 A1* | 7/2004 | Inomata | G03F 7/0047 430/270.1 |
| 2008/0097032 A1* | 4/2008 | Ito | C08F 212/12 525/185 |
| 2010/0276186 A1 | 11/2010 | Sasaki et al. | |
| 2011/0254178 A1* | 10/2011 | Matsutani | G03F 7/0233 257/788 |
| 2012/0296053 A1* | 11/2012 | Hanamura | C08L 61/12 525/480 |

FOREIGN PATENT DOCUMENTS

| | | |
|---|---|---|
| JP | 2007057595 A | 3/2007 |
| JP | 2008309885 A | 12/2008 |
| JP | 2009047761 A | 3/2009 |
| JP | 2009244663 A | 3/2009 |
| JP | 2009024663 A | 10/2009 |
| JP | 2010073948 A | 4/2010 |
| TW | 200304583 A | 10/2003 |
| WO | 2007122929 A1 | 11/2007 |
| WO | 2008026406 A1 | 3/2008 |

OTHER PUBLICATIONS

International Search Report for International Application No. PCT/JP2013/077525 dated May 14, 2015.
International Search Report for International Application No. PCT/JP2013/077525 dated Dec. 3, 2013.
Supplementary European Search Report, mailed Sep. 20, 2016, for European Application No. 13850182.0.
Office Action mailed Jan. 23, 2017, in Taiwanese Application No. 102138359.

* cited by examiner (a)

(b)

(a)

(b)

(a)

(b)

(a)

(b)

PHOTOSENSITIVE RESIN COMPOSITION, METHOD FOR PRODUCING PATTERNED CURED FILM, SEMICONDUCTOR ELEMENT AND ELECTRONIC DEVICE

TECHNICAL FIELD

The present invention relates to a photosensitive resin composition, a method for producing a patterned cured film, a semiconductor element, and an electronic device.

BACKGROUND ART

In recent years, it has been demanded with high integration and miniaturization of semiconductor elements that surface protecting layers and interlayer insulating layers of the semiconductor elements have better electric properties (dielectric constant and the like), heat resistances (thermal expansion coefficient, glass transition temperature and the like), mechanical properties (elastic modulus, elongation at break, and the like), and the like. As materials to form surface protecting layers and interlayer insulating layers simultaneously having such properties, photosensitive resin compositions containing an alkali-soluble resin having a phenolic hydroxyl group are developed (see, for example, Patent Literatures 1, 2 and 3). These photosensitive resin compositions are applied and dried on substrates to thereby form resin films, and the resin films are exposed and developed to thereby obtain patterned resin films (resin films where patterns are formed). Then, the patterned resin films are thermally cured to be thereby able to form patterned cured films (cured films where patterns are formed), and the patterned cured films can be used as surface protecting layers and interlayer insulating layers. Further, these photosensitive resin compositions have an advantage of being capable of being thermally cured at a low temperature in a step of forming patterned cured films.

CITATION LIST

Patent Literature

Patent Literature 1: JP2008-309885A
Patent Literature 2: JP2007-57595A
Patent Literature 3: WO2010/073948

SUMMARY OF INVENTION

Technical Problem

Then, in a photosensitive resin composition, in the case where the compatibility of each component such as a resin and a photosensitizer is poor, the photosensitive resin composition becomes cloudy, and further a patterned cured film formed on a substrate is likely to become cloudy. When a patterned cured film becomes cloudy, in a producing step of a semiconductor element after the patterned cured film is formed, marks for alignment made on a substrate are hardly recognized and the work becomes difficult.

A patterned cured film formed from a photosensitive resin composition, when a semiconductor element is formed and the formed semiconductor element is mounted on a wiring board, is exposed to various high-temperature conditions and low-temperature conditions. Therefore, it is demanded not only that mechanical properties are excellent, but also that the changing rates of the mechanical properties after being left at a high temperature and after a thermal shock test are low. When the changing rates of the mechanical properties after being left at a high temperature and after a thermal shock test are high, there arises a problem of generating cracks in a patterned cured film.

However, it is difficult that conventional photosensitive resin compositions satisfy all of such properties that the white turbidity can sufficiently be suppressed; the mechanical properties of a formed patterned cured film are excellent; and the changing rates of the mechanical properties after being left at a high temperature and after a thermal shock test are low.

Then, the present invention has an object to provide a photosensitive resin composition in which white turbidity can sufficiently be suppressed; mechanical properties of a formed patterned cured film are excellent; and the changing rates of mechanical properties after being left at a high temperature and after a thermal shock test are low. The present invention has also an object to provide a method for producing a patterned cured film using the photosensitive resin composition, a semiconductor element having the patterned cured film as an interlayer insulating layer or a surface protecting layer, and an electronic device having the semiconductor element.

Solution to Problem

The present invention relates to the following.
<1> A photosensitive resin composition, comprising:
(A) an alkali-soluble resin having a structural unit represented by the following formula (1):

[Chemical Formula 1]

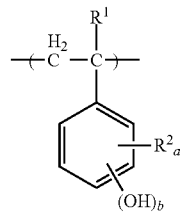

wherein $R^1$ represents a hydrogen atom or a methyl group; $R^2$ represents an alkyl group having 1 to 10 carbon atoms, an aryl group having 6 to 10 carbon atoms or an alkoxy group having 1 to 10 carbon atoms; and a represents an integer of 0 to 3, b represents an integer of 1 to 3, and the total of a and b is 5 or less;
(B) a compound that generates an acid by light;
(C) a thermal crosslinking agent; and
(D) an acryl resin having a structural unit represented by the following formula (2):

[Chemical Formula 2]

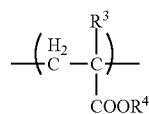

wherein $R^3$ represents a hydrogen atom or a methyl group; and $R^4$ represents a hydroxyalkyl group having 2 to 20 carbon atoms.

<2> The photosensitive resin composition according to <1>, wherein the (D) component is the acryl resin further having a structural unit represented by the following formula (3):

[Chemical Formula 3]

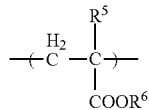
(3)

wherein $R^5$ represents a hydrogen atom or a methyl group; and $R^6$ represents a monovalent organic group having a primary, secondary or tertiary amino group.
<3> The photosensitive resin composition according to <1> or <2>, wherein the (D) component is the acryl resin further having a structural unit represented by the following formula (4):

[Chemical Formula 4]

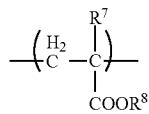
(4)

wherein $R^7$ represents a hydrogen atom or a methyl group; and $R^8$ represents an alkyl group having 4 to 20 carbon atoms.
<4> The photosensitive resin composition according to any one of <1> to <3>, wherein the (D) component is the acryl resin further having a structural unit represented by the following formula (5):

[Chemical Formula 5]

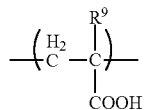
(5)

wherein $R^9$ represents a hydrogen atom or a methyl group.
<5> The photosensitive resin composition according to any one of <1> to <4>, wherein the (A) component is the alkali-soluble resin further having a structural unit represented by the following formula (6):

[Chemical Formula 6]

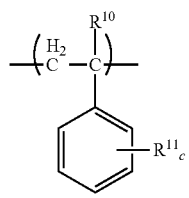
(6)

wherein $R^{10}$ represents a hydrogen atom or a methyl group; $R^{11}$ represents an alkyl group having 1 to 10 carbon atoms, an aryl group having 6 to 10 carbon atoms or an alkoxy group having 1 to 10 carbon atoms; and c represents an integer of 0 to 3.
<6> The photosensitive resin composition according to any one of <1> to <5>, wherein the (A) component is the alkali-soluble resin further having a structural unit represented by the following formula (7):

[Chemical Formula 7]

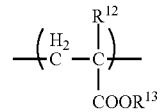
(7)

wherein $R^{12}$ represents a hydrogen atom or a methyl group; and $R^{13}$ represents an alkyl group having 1 to 10 carbon atoms or a hydroxyalkyl group having 1 to 10 carbon atoms.
<7> The photosensitive resin composition according to any one of <1> to <6>, wherein the (B) component is an o-quinone diazide compound.

Then, in a photosensitive resin composition, since when the solubility is made high, also the solubility of unexposed portions is improved, there sometimes arises such a problem that the remaining film ratio after the development decreases. By contrast, when the solubility is decreased, there sometimes arise such a problem that an undissolved residue is produced in patterned openings, leading to a decrease in the resolution and a connection failure in metal wiring formation, such a problem that since a high exposure amount is needed, the workability decreases, and other problems.

Therefore, in a photosensitive resin composition, the higher the dissolution contrast between exposed portions and unexposed portions, the more the above-mentioned problems can be suppressed. By making a photosensitive resin composition according to the present embodiment to have constitutions of <8> and <9>, the photosensitive resin composition having an excellent dissolution contrast between exposed portions and unexposed portions can be provided.
<8> The photosensitive resin composition according to any one of <1> to <7>, wherein the (C) component comprises a thermal crosslinking agent having an alkoxymethyl group; and the photosensitive resin composition further comprises (E) a phenolic low molecular weight compound.
<9> The photosensitive resin composition according to <8>, wherein the (E) component is a phenolic low molecular weight compound represented by the following formula (13), (14) or (15):

[Chemical Formula 8]

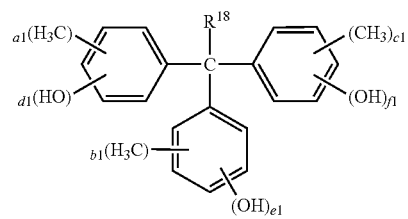
(13)

wherein $R^{18}$ represents a hydrogen atom or a methyl group; and a1 to f1 represent an integer of 0 to 3, the total of d1 to f1 is 1 or more, the total of a1 and d1 is 5 or less, the total of b1 and e1 is 5 or less, and the total of c1 and f1 is 5 or less;

[Chemical Formula 9]

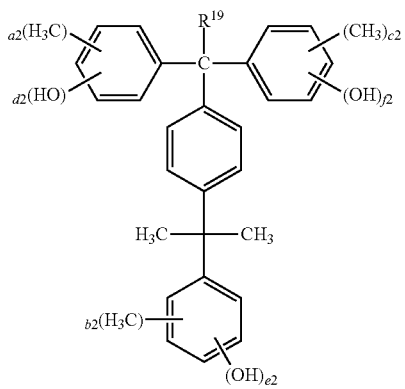

(14)

wherein $R^{19}$ represents a hydrogen atom or a methyl group; and a2 to c2 represent an integer of 0 to 3, d2 to f2 represent an integer of 1 to 3, the total of a2 and d2 is 5 or less, the total of b2 and e2 is 5 or less, and the total of c2 and f2 is 5 or less; or

[Chemical Formula 10]

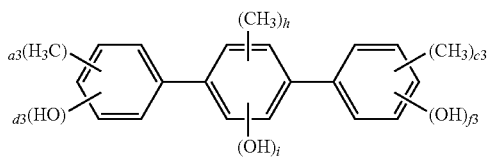

(15)

wherein a3, c3, h and i represent an integer of 0 to 3, d3 and f3 represent an integer of 1 to 3, the total of a3 and d3 is 5 or less, the total of c3 and f3 is 5 or less, and the total of h and i is 4 or less.

<10> A patterned cured film, being obtained by heating the photosensitive resin composition according to any one of <1> to <9>.

<11> A method for producing a patterned cured film, comprising: a step of applying and drying the photosensitive resin composition according to any one of <1> to <9> on a part or the whole of a substrate to thereby form a resin film, a step of exposing a part or the whole of the resin film, a step of developing the resin film after the exposure with an alkali aqueous solution to thereby form a patterned resin film, and a step of heating the patterned resin film.

<12> A semiconductor element, having a patterned cured film formed by the method for producing a patterned cured film according to <11>, as an interlayer insulating layer.

<13> A semiconductor element, having a patterned cured film formed by the method for producing a patterned cured film according to <11>, as a surface protecting layer.

<14> An electronic device, comprising the semiconductor element according to <12> or <13>.

Advantageous Effects of Invention

According to the present invention, a photosensitive resin composition can be provided in which white turbidity can sufficiently be suppressed; mechanical properties of a formed patterned cured film are excellent; and the changing rates of the mechanical properties after being left at a high temperature and after a thermal shock test are low. There can further be provided a method for producing a patterned cured film using the photosensitive resin composition, a semiconductor element having the patterned cured film as an interlayer insulating layer or a surface protecting layer, and an electronic device having the semiconductor element.

DESCRIPTION OF EMBODIMENTS

[Photosensitive Resin Composition]

Figure 1:
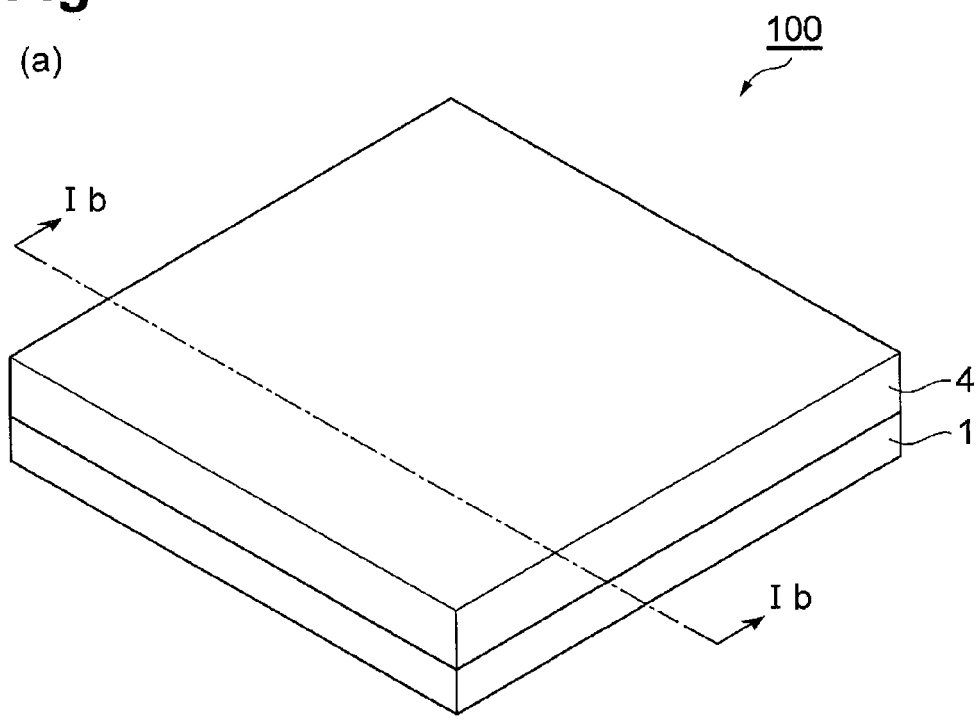
FIG. 1a is a schematic perspective view and FIG. 1b is a schematic end view illustrating one embodiment of a producing process of a semiconductor element.
Figure 1:
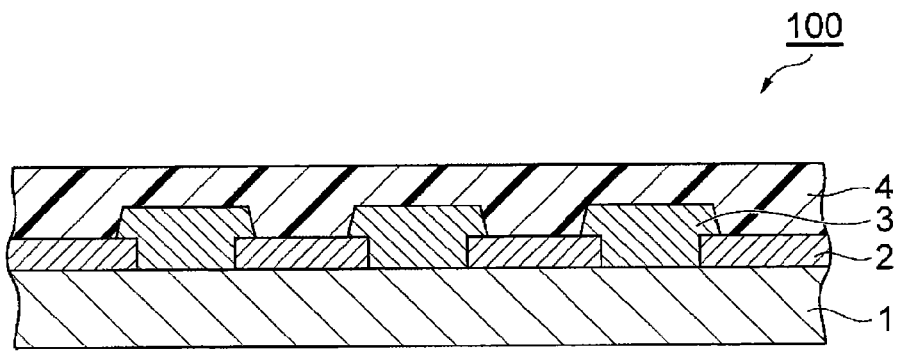

The photosensitive resin composition according to the present embodiment contains (A) an alkali-soluble resin, (B) a compound that generates an acid by light, (C) a thermal crosslinking agent and (D) an acryl resin.

First, each component which a photosensitive resin composition contains will be described.

<(A) Component>

(A) component is an alkali-soluble resin (soluble to an alkali aqueous solution). Here, one criterion that an (A) component in the present invention is soluble to an alkali aqueous solution will be described hereinafter. A resin solution obtained from the (A) component singly and an optional solvent, or a resin solution obtained from the (A) component, and a (B) component, a (C) component and a (D) component, which will be described in due order hereinafter, is spin coated on a substrate such as a silicon wafer to thereby form a resin film of about 5 μm in film thickness. The resin film is immersed in any one of a tetramethylammonium hydroxide aqueous solution, a metal hydroxide aqueous solution and an organic amine aqueous solution at 20 to 25° C. As a result, when the resin film is capable of being dissolved as a homogeneous solution, such a judgment is made that the used (A) component is soluble to the alkali aqueous solution.

An alkali-soluble resin as an (A) component has a structural unit represented by the following formula (1):

[Chemical Formula 11]

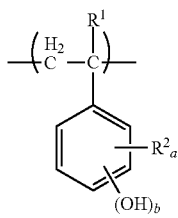

(1)

wherein $R^1$ represents a hydrogen atom or a methyl group; $R^2$ represents an alkyl group having 1 to 10 carbon atoms, an aryl group having 6 to 10 carbon atoms or an alkoxy group having 1 to 10 carbon atoms; and a represents an integer of 0 to 3, b represents an integer of 1 to 3, and the total of a and b is 5 or less.

(A) an alkali-soluble resin is obtained by polymerizing a monomer and the like imparting a structural unit represented by the formula (1).

Examples of alkyl groups having 1 to 10 carbon atoms represented by $R^2$ in the formula (1) include a methyl group, an ethyl group, a propyl group, a butyl group, a pentyl group, a hexyl group, a heptyl group, an octyl group, a nonyl group, and a decyl group. These groups may be a straight chain one or a branched chain one. Examples of aryl groups having 6 to 10 carbon atoms include a phenyl group and a naphthyl group. Examples of alkoxy groups having 1 to 10 carbon atoms include a methoxy group, an ethoxy group, a propoxy group, a butoxy group, a pentoxy group, a hexoxy group, a heptoxy group, an octoxy group, a nonoxy group, and a decoxy group. These groups may be a straight chain one or a branched chain one.

Examples of monomers imparting a structural unit represented by the formula (1) include p-hydroxystyrene, m-hydroxystyrene, o-hydroxystyrene, p-isopropenylphenol, m-isopropenylphenol, and o-isopropenylphenol. These monomers can be used singly or in a combination of two or more.

A method of obtaining (A) an alkali-soluble resin is not especially limited, but it can be obtained, for example, by protecting a hydroxyl group of a monomer imparting a structural unit represented by the formula (1) with a t-butyl group, an acetyl group or the like to thereby make a monomer whose hydroxyl group is protected, polymerizing the monomer whose hydroxyl group is protected to thereby obtain a polymer, and further deprotecting the obtained polymer by a well-known method (the deprotection is carried out, for example, in the presence of an acid catalyst to convert to a hydroxystyrene-based structural unit).

An (A) component may be a polymer composed only of a monomer or a copolymer imparting a structural unit represented by the formula (1), or may be a copolymer of a monomer imparting a structural unit represented by the formula (1) and other monomers. In the case where an (A) component is a copolymer, from the viewpoint of the solubility of exposed portions to an alkali developing solution, it is preferable that the proportion of a structural unit represented by the formula (1) in the copolymer is 10 to 100 mol % with respect to 100 mol % of the (A) component; 20 to 97 mol % is more preferable; 30 to 95 mol % is still more preferable; and 50 to 95 mol % is especially preferable.

From the viewpoint of more improving the dissolution inhibition of unexposed portions to an alkali developing solution, it is preferable that an (A) component is the alkali-soluble resin further having a structural unit represented by the following formula (6):

[Chemical Formula 12]

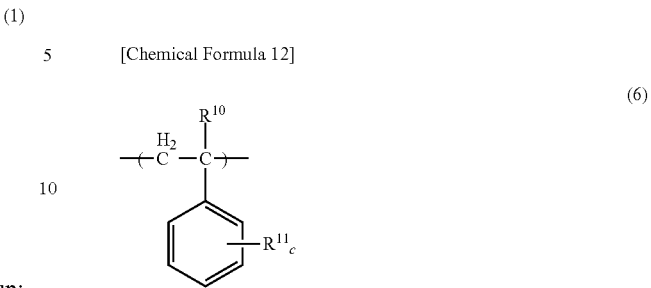

(6)

wherein $R^{10}$ represents a hydrogen atom or a methyl group; $R^{11}$ represents an alkyl group having 1 to 10 carbon atoms, an aryl group having 6 to 10 carbon atoms or an alkoxy group having 1 to 10 carbon atoms; and c represents an integer of 0 to 3.

Examples of the alkyl group having 1 to 10 carbon atoms, the aryl group having 6 to 10 carbon atoms or the alkoxy group having 1 to 10 carbon atoms represented by $R^{11}$ can each be the same as in $R^2$.

An alkali-soluble resin having a structural unit represented by the formula (6) can be obtained by using a monomer imparting the structural unit represented by the formula (6). Examples of the monomer imparting the structural unit represented by the formula (6) include aromatic vinyl compounds such as styrene, α-methylstyrene, o-methylstyrene, m-methylstyrene, p-methylstyrene, o-methoxystyrene, m-methoxystyrene and p-methoxystyrene. These monomers can be used singly or in a combination of two or more.

In the case where an (A) component is an alkali-soluble resin having a structural unit represented by the formula (6), from the viewpoint of the dissolution inhibition of unexposed portions to an alkali developing solution and the mechanical properties of a patterned cured film, it is preferable that the proportion of the structural unit represented by the formula (6) is 1 to 90 mol % with respect to 100 mol % of the (A) component; 3 to 80 mol % is more preferable; 5 to 70 mol % is still more preferable; and 5 to 50 mol % is especially preferable.

Further from the viewpoint of lowering the elastic modulus, it is preferable that an (A) component is the alkali-soluble resin further having a structural unit represented by the following formula (7):

[Chemical Formula 13]

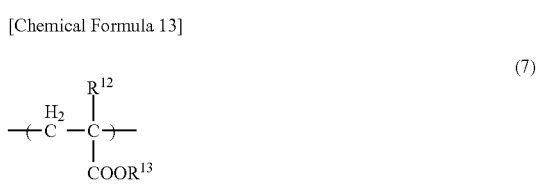

(7)

wherein $R^{12}$ represents a hydrogen atom or a methyl group; and $R^{13}$ represents an alkyl group having 1 to 10 carbon atoms or a hydroxyalkyl group having 1 to 10 carbon atoms.

An alkali-soluble resin having a structural unit represented by the formula (7) can be obtained by using a monomer imparting the structural unit represented by the formula (7). Examples of the monomer imparting the structural unit represented by the formula (7) include methyl (meth)acrylate, ethyl(meth)acrylate, propyl(meth)acrylate, butyl(meth)acrylate, pentyl(meth)acrylate, hexyl(meth) acrylate, heptyl(meth)acrylate, octyl(meth)acrylate, nonyl (meth)acrylate, decyl(meth)acrylate, hydroxymethyl(meth) acrylate, hydroxyethyl(meth)acrylate, hydroxypropyl(meth) acrylate, hydroxybutyl(meth)acrylate, hydroxypentyl(meth) acrylate, hydroxyhexyl(meth)acrylate, hydroxyheptyl(meth) acrylate, hydroxyoctyl(meth)acrylate, hydroxynonyl(meth) acrylate, and hydroxydecyl(meth)acrylate. These monomers can be used singly or in a combination of two or more.

In the case where an (A) component is an alkali-soluble resin having a structural unit represented by the formula (7), from the viewpoint of the dissolution inhibition of unexposed portions to an alkali developing solution and the mechanical properties of a patterned cured film, it is preferable that the proportion of the structural unit represented by the formula (7) is 1 to 90 mol % with respect to 100 mol % of the (A) component; 3 to 80 mol % is more preferable; 5 to 70 mol % is still more preferable; and 5 to 50 mol % is especially preferable.

From the viewpoint of the dissolution inhibition of unexposed portions to an alkali developing solution and the mechanical properties of a patterned cured film, it is preferable that an (A) component is an alkali-soluble resin having a structural unit represented by the formula (1) and a structural unit represented by the formula (6), an alkali-soluble resin having a structural unit represented by the formula (1) and a structural unit represented by the formula (7), or an alkali-soluble resin having a structural unit represented by the formula (1), a structural unit represented by the formula (6) and a structural unit represented by the formula (7). From the viewpoint of more developing the advantage of the present invention, it is more preferable that an (A) component is an alkali-soluble resin having a structural unit represented by the formula (1) and a structural unit represented by the formula (6) or (7).

In consideration of the balance among the solubility to an alkali aqueous solution, the photosensitive properties and the mechanical properties of a patterned cured film, it is preferable that the molecular weight of an (A) component is 1000 to 500000 in weight-average molecular weight; 2000 to 200000 is more preferable; and 2000 to 100000 is still more preferable. Here, the weight-average molecular weight is a value obtained by the measurement using gel permeation chromatography (GPC), and the conversion using a standard polystyrene calibration curve.

<(B) Component>

A compound that generates an acid by light (when exposed to light) as a (B) component functions as a photosensitizer in a photosensitive resin composition. The (B) component generates an acid when exposed to light irradiation, and has a function of increasing the solubility of light-irradiated portions to an alkali aqueous solution. As the (B) component, a compound generally called a photoacid generating agent can be used. Specific examples of the (B) component include o-quinone diazide compounds, aryldiazonium salts, diaryliodonium salts and triarylsulfonium salts. A (B) component may be composed of only one of these compounds, or may be constituted by containing two or more thereof. Among these, o-quinone diazide compounds are preferable because being highly sensitive.

As an o-quinone diazide compound, there can be used, for example, one obtained by condensation reacting o-quinone diazidesulfonyl chloride and a hydroxyl compound and/or an amino compound and the like in the presence of a dehydrochlorinating agent.

Examples of o-quinone diazidesulfonyl chloride used in the reaction include benzoquinone-1,2-diazide-4-sulfonyl chloride, naphthoquinone-1,2-diazide-5-sulfonyl chloride, and naphthoquinone-1,2-diazide-6-sulfonyl chloride.

Examples of the hydroxyl compound used in the reaction include hydroquinone, resorcinol, pyrogallol, bisphenol A, bis(4-hydroxyphenyl)methane, 1,1-bis(4-hydroxyphenyl)-1-[4-{1-(4-hydroxyphenyl)-1-methylethyl}phenyl]ethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, and tris(4-hydroxyphenyl)ethane.

Examples of the amino compound used in the reaction include p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl) sulfone, bis(3-amino-4-hydroxyphenyl)hexafluoropropane, and bis(4-amino-3-hydroxyphenyl)hexafluoropropane.

Among these, it is preferable from the viewpoint of the reactivity when an o-quinone diazide compound is synthesized and the viewpoint of a proper absorption wavelength range when a resin film is exposed, that there is used an o-quinone diazide compound obtained by condensation reacting 1,1-bis(4-hydroxyphenyl)-1-[4-{1-(4-hydroxyphenyl)-1-methylethyl}phenyl]ethane and 1-naphtoquinone-2-diazide-5-sulfonyl chloride, or one obtained by condensation reacting tris(4-hydroxyphenyl)methane or tris(4-hydroxyphenyl)ethane and 1-naphtoquinone-2-diazide-5-sulfonyl chloride.

Examples of the dehydrochlorinating agent used in the reaction include sodium carbonate, sodium hydroxide, sodium hydrogenecarbonate, potassium carbonate, potassium hydroxide, trimethylamine, triethylamine, and pyridine. As the reaction solvent, for example, dioxane, acetone, methyl ethyl ketone, tetrahydrofuran, diethyl ether, and N-methylpyrrolidone are used.

It is preferable that o-quinone diazidesulfonyl chloride and a hydroxyl compound and/or an amino compound are blended so that the total of the numbers of moles of a hydroxyl group and an amino group is 0.5 to 1 mol with respect to 1 mol of o-quinone diazidesulfonyl chloride. The preferable blend proportion of the dehydrochlorinating agent to o-quinone diazidesulfonyl chloride is in the range of 0.95/1 mol to 1/0.95 mol equivalent.

The preferable reaction temperature for the above-mentioned reaction is 0 to 40° C., and the preferable reaction time is 1 to 10 hours.

It is preferable that the content of a (B) component is 3 to 100 parts by mass with respect to 100 parts by mass of an (A) component; 5 to 50 parts by mass is more preferable; 5 to 30 parts by mass is still more preferable; and 5 to 20 parts by mass is especially preferable, because the dissolving speed difference between exposed portions and unexposed portions becomes large, making the sensitivity better.

<(C) Component>

A thermal crosslinking agent as a (C) component is a compound having a structure capable of reacting with an (A) component and forming a crosslinked structure when a patterned resin film is heated and cured. This can prevent the brittleness of a film and the melt of the film. Examples of the (C) component include compounds having a phenolic hydroxyl group, compounds having an alkoxymethylamino group and compounds having an epoxy group.

A "compound having a phenolic hydroxyl group" mentioned herein does not include (A) the alkali-soluble resin and (E) the phenolic low molecular weight compound. The compound having a phenolic hydroxyl group as a thermal crosslinking agent not only serves as a thermal crosslinking agent but also can increase the dissolution speed of exposed portions in the development with an alkali aqueous solution and improve the sensitivity. In consideration of the balance among the solubility to an alkali aqueous solution, the photosensitive properties and the mechanical properties, it is preferable that the weight-average molecular weight of such a compound having a phenolic hydroxyl group is 2000 or lower; 94 to 2000 is more preferable; 108 to 2000 is still more preferable; and 108 to 1500 is especially preferable.

As the compound having a phenolic hydroxyl group, conventionally well-known ones can be used, but a compound having an alkoxymethyl group and a phenolic hydroxyl group is preferable; and a compound represented by the following formula (8) is more preferable, because of being excellent in the balance between the effect of promoting the dissolution of exposed portions and the effect of preventing the melt of a photosensitive resin film in curing.

[Chemical Formula 14]

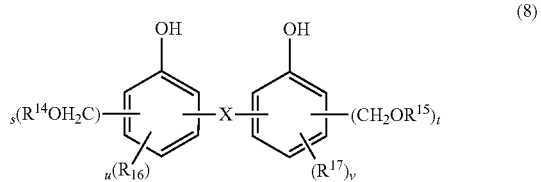

(8)

wherein X represents a single bond or a divalent organic group; $R^{14}$, $R^{15}$, $R^{16}$ and $R^{17}$ each independently represent a hydrogen atom or a monovalent organic group; and s and t each independently represent an integer of 1 to 3, and u and v each independently represent an integer of 0 to 3.

In the formula (8), compounds in which X is a single bond are biphenol (dihydroxybiphenyl) derivatives. Examples of divalent organic groups represented by X include alkylene groups having 1 to 10 carbon atoms such as a methylene group, an ethylene group and a propylene group, alkylidene groups having 2 to 10 carbon atoms such as an ethylidene group, arylene groups having 6 to 30 carbon atoms such as a phenylene group, groups in which a part or the whole of a hydrogen atom of these hydrocarbon groups is substituted with a halogen atom such as a fluorine atom, a sulfonyl group, a carbonyl group, an ether bond, a thioether bond, and an amide bond. Further, examples of the monovalent organic groups represented by $R^{14}$, $R^{15}$, $R^{16}$ and $R^{17}$ include alkyl groups having 1 to 10 carbon atoms such as a methyl group, an ethyl group and a propyl group, alkenyl groups having 2 to 10 carbon atoms such as a vinyl group, aryl groups having 6 to 30 carbon atoms such as a phenyl group, and groups in which a part or the whole of these hydrocarbon groups is substituted with a halogen atom such as a fluorine atom.

As a compound represented by the above formula (8), there can be used, for example, 1,1-bis {3,5-bis(methoxymethyl)-4-hydroxyphenyl}methane (made by Honshu Chemical Industry Co., Ltd., trade name: "TMOM-pp-BPF").

Examples of a compound having an alkoxymethylamino group include nitrogen-containing compounds in which the whole or a part of an active methylol group of (poly)(N-hydroxymethyl)melamine, (poly)(N-hydroxymethyl)glycoluril, (poly)(N-hydroxymethyl)benzoguanamine, and (poly)(N-hydroxymethyl) urea or the like is alkyl-etherified. Here, examples of alkyl groups in the alkyl ethers include a methyl group, an ethyl group, and a butyl group, and oligomer components partially self-condensed may be contained. Specific examples of a compound having an alkoxymethylamino group include hexakis(methoxymethyl) melamine, hexakis(butoxymethyl)melamine, tetrakis (methoxymethyl)glycoluril, tetrakis(butoxymethyl)glycoluril, and tetrakis(methoxymethyl)urea.

As the compound having an epoxy group, conventionally well-known ones can be used. Specific examples thereof include bisphenol A epoxy resins, bisphenol F epoxy resins, phenol novolac-type epoxy resins, cresol novolac-type epoxy resins, alicyclic epoxy resins, glycidylamines, heterocyclic epoxy resins, and polyalkylene glycol diglycidyl ethers.

As the (C) component, other than the above-mentioned compounds, there can also be used, for example, aromatic compounds having a hydroxymethyl group such as bis[3,4-bis(hydroxymethyl)phenyl]ether, 1,3,5-tris(1-hydroxy-1-methylethyl)benzene or the like, compounds having a maleimide group such as bis(4-maleimidephenyl)methane, 2,2-bis[(4-(4'-maleimidephenoxy)phenyl)]propane or the like, compounds having a norbornene skeleton, polyfunctional acrylate compounds, compounds having an oxetanyl group, compounds having a vinyl group, and blocked isocyanate compounds.

Among the above-mentioned (C) components, compounds having an alkoxymethyl group and a phenolic hydroxyl group or compounds having an alkoxymethylamino group are preferably used from the viewpoint of being capable of more improving the sensitivity and the heat resistance; and from the viewpoint of being capable of more improving the resolution and the elongation of a coated film as well, compounds having an alkoxymethylamino group are more preferable; compounds having an alkoxymethylamino group in which the whole or a part of hydroxymethylamino groups is alkyl-etherified are still more preferable; and compounds having an alkoxymethylamino group in which the whole of hydroxymethylamino groups is alkyl-etherified are especially preferable.

Among the compounds having an alkoxymethylamino group in which the whole of hydroxymethylamino groups is alkyl-etherified, a compound represented by the following formula (9) is preferable.

[Chemical Formula 15]

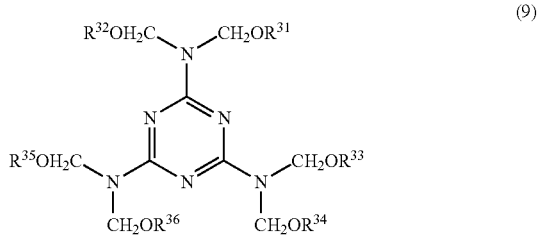

(9)

wherein $R^{31}$ to $R^{36}$ each independently represent an alkyl group having 1 to 10 carbon atoms.

Examples of alkyl groups having 1 to 10 carbon atoms represented by $R^{31}$ to $R^{36}$ in the formula (9) include a methyl group, an ethyl group, a propyl group, a butyl group, a pentyl group, a hexyl group, a heptyl group, an octyl group, a nonyl group and a decyl group. These groups may be a straight chain one or a branched chain one.

From the viewpoint that the dissolution speed difference between exposed portions and unexposed portions becomes large and the sensitivity becomes good, it is preferable that the content of a (C) component is 0.5 to 50 parts by mass with respect to 100 parts by mass of an (A) component; 1 to 40 parts by mass is more preferable; and 2 to 30 parts by mass is still more preferable.

<(D) Component>

An acryl resin as the (D) component has a structural unit represented by the following formula (2).

[Chemical Formula 16]

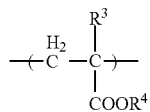
(2)

wherein $R^3$ represents a hydrogen atom or a methyl group; and $R^4$ represents a hydroxyalkyl group having 2 to 20 carbon atoms.

In a photosensitive resin composition according to the present embodiment, the white turbidity of the photosensitive resin composition can sufficiently be suppressed and the haze value of a patterned cured film can be made low by the incorporation of a (D) component having a structural unit represented by the formula (2). Further by the incorporation of a (D) component, the photosensitive properties and the heat shock properties (the changing rates of mechanical properties after being left at a high temperature and after a thermal shock test are low) can be improved more. The (D) component may be composed only of one acryl resin or may contain two or more acryl resins.

Since the interaction of a (D) component and an (A) component becomes good and the compatibility thereof is improved by the incorporation of a structural unit represented by the formula (2) in the (D) component, the adherence to a substrate, the mechanical properties and the heat shock properties of resist patterns can be improved more.

From the viewpoint of being able to more improve the compatibility with an (A) component and the heat shock properties, it is preferable that $R^4$ in the formula (2) is a hydroxyalkyl group having 2 to 15 carbon atoms; a hydroxyalkyl group having 2 to 10 carbon atoms is more preferable; and a hydroxyalkyl group having 2 to 8 carbon atoms is especially preferable.

Examples of hydroxyalkyl groups having 2 to 20 carbon atoms represented by $R^4$ include a hydroxyethyl group, a hydroxypropyl group, a hydroxybutyl group, a hydroxypentyl group, a hydroxyhexyl group, a hydroxyheptyl group, a hydroxyoctyl group, a hydroxynonyl group, a hydroxydecyl group, a hydroxyundecyl group, a hydroxydodecyl group (it may be called a hydroxylauryl group), a hydroxytridecyl group, a hydroxytetradecyl group, a hydroxypentadecyl group, a hydroxyhexadecyl group, a hydroxyheptadecyl group, a hydroxyoctadecyl group, a hydroxynonadecyl group, and a hydroxyeicosyl group. These groups may be a straight chain one or a branched chain one.

Examples of monomers making an acryl resin having a structural unit represented by the formula (2) include hydroxyalkyl(meth)acrylates. An example of such a hydroxyalkyl(meth)acrylate includes a compound represented by the following formula (10):

$$CH_2=C(R^3)-COOR^4 \quad (10)$$

wherein $R^3$ represents a hydrogen atom or a methyl group; and $R^4$ represents a hydroxyalkyl group having 2 to 20 carbon atoms.

From the viewpoint of being able to more highly develop the advantage of the present invention, it is desirable that an acryl resin having a structural unit represented by the formula (2) is added as a polymer.

Examples of monomers represented by the formula (10) include hydroxyethyl(meth)acrylate, hydroxypropyl(meth)acrylate, hydroxybutyl(meth)acrylate, hydroxypentyl(meth)acrylate, hydroxyhexyl(meth)acrylate, hydroxyheptyl(meth)acrylate, hydroxyoctyl(meth)acrylate, hydroxynonyl(meth)acrylate, hydroxydecyl(meth)acrylate, hydroxyundecyl(meth)acrylate, hydroxydodecyl(meth)acrylate (it may be called hydroxylauryl(meth)acrylate), hydroxytridecyl(meth)acrylate, hydroxytetradecyl(meth)acrylate, hydroxypentadecyl(meth)acrylate, hydroxyhexadecyl(meth)acrylate, hydroxyheptadecyl(meth)acrylate, hydroxyoctadecyl(meth)acrylate, hydroxynonadecyl(meth)acrylate, and hydroxyeicosyl(meth)acrylate. These monomers are used singly or in a combination of two or more. Among these, from the viewpoint of more improving the compatibility with an (A) component and the elongation at break, it is preferable that there is used hydroxyethyl(meth)acrylate, hydroxypropyl(meth)acrylate, hydroxybutyl(meth)acrylate, hydroxypentyl(meth)acrylate, hydroxyhexyl(meth)acrylate, hydroxyheptyl(meth)acrylate, hydroxyoctyl(meth)acrylate, hydroxynonyl(meth)acrylate, hydroxydecyl(meth)acrylate, hydroxyundecyl(meth)acrylate, or hydroxydodecyl(meth)acrylate.

A (D) component may be an acryl resin composed only of a structural unit represented by the formula (2) or may be an acryl resin having a structural unit other than the structural unit represented by the formula (2). In the case of an acryl resin having a structural unit other than the structural unit represented by the formula (2), it is preferable that the proportion of the structural unit represented by the formula (2) in the acryl resin is 0.1 to 30 mol % with respect to the total amount of the (D) component; 0.3 to 20 mol % is more preferable; and 0.5 to 10 mol % is still more preferable. When the compositional ratio of a structural unit represented by the above formula (2) is 0.1 to 30 mol %, the compatibility with an (A) component and the heat shock properties of a patterned cured film can be improved more.

It is preferable that a (D) component is the acryl resin further having a structural unit represented by the following formula (3):

[Chemical Formula 17]

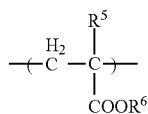
(3)

wherein $R^5$ represents a hydrogen atom or a methyl group; and $R^6$ represents a monovalent organic group having a primary, secondary or tertiary amino group.

When a (D) component has a structural unit represented by the formula (3), the dissolution inhibition of unexposed portions to a developing solution can be improved more.

Examples of a monomer imparting an acryl resin having a structural unit represented by the formula (3) include aminoethyl(meta)acrylate, N-methylaminoethyl(meta)acrylate, N,N-dimethylaminoethyl(meta)acrylate, N-ethylaminoethyl(meta)acrylate, N,N-diethylamino ethyl(meta)acrylate, aminopropyl(meta)acrylate, N-methylaminopropyl (meta)acrylate, N,N-dimethylaminopropyl(meta)acrylate, N-ethylaminopropyl(meta)acrylate, N,N-diethylaminopropyl(meta)acrylate, piperidin-4-yl(meta)acrylate, 1-methylpiperidin-4-yl(meta)acrylate, 2,2,6,6-tetramethylpiperidin-4-yl(meta)acrylate, 1,2,2,6,6-pentamethylpiperidin-4-yl(meta) acrylate, (piperidin-4-yl)methyl(meta)acrylate, and 2-(piperidin-4-yl)ethyl(meta)acrylate. These monomers are used singly or in a combination of two or more. Among these, from the viewpoint of more improving the adherence to a substrate, the mechanical properties and the heat shock properties of a patterned cured film, it is preferable that $R^6$ in the formula (3) is a monovalent organic group represented by the following formula (11):

[Chemical Formula 18]

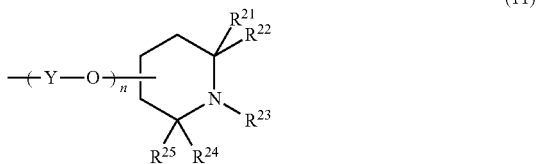

(11)

wherein Y represents an alkylene group having 1 to 5 carbon atoms; $R^{21}$ to $R^{25}$ each independently represent a hydrogen atom or an alkyl group having 1 to 20 carbon atoms; and n represents an integer of 0 to 10.

In the formula (3), examples of a polymerizable monomer imparting a structural unit whose $R^6$ is represented by a monovalent organic group represented by the formula (11) include piperidin-4-yl(meta)acrylate, 1-methylpiperidin-4-yl(meta)acrylate, 2,2,6,6-tetramethylpiperidin-4-yl(meta) acrylate, 1,2,2,6,6-pentamethylpiperidin-4-yl(meta)acrylate, (piperidin-4-yl)methyl(meta)acrylate, and 2-(piperidin-4-yl) ethyl(meta)acrylate. Among these, 1,2,2,6,6-pentamethylpiperidin-4-yl methacrylate and 2,2,6,6-tetramethylpiperidin-4-yl methacrylate are preferable because of being commercially available as FA-711MM and FA-712HM (both are made by Hitachi Chemical Co., Ltd.), respectively.

In the case where (D) an acryl resin has a structural unit represented by the formula (3), from the viewpoint of the compatibility with an (A) component and the solubility to a developing solution, it is preferable that the proportion of the structural unit represented by the formula (3) is 0.3 to 10 mol % with respect to the total amount of the (D) component; 0.4 to 6 mol % is more preferable; and 0.5 to 5 mol % is still more preferable.

It is preferable that a (D) component is the acryl resin further having a structural unit represented by the following formula (4):

[Chemical Formula 19]

(4)

wherein $R^7$ represents a hydrogen atom or a methyl group; and $R^8$ represents an alkyl group having 4 to 20 carbon atoms.

When a (D) component has a structural unit represented by the formula (4), the dissolution inhibition of unexposed portions to a developing solution can be improved more.

Examples of alkyl groups having 4 to 20 carbon atoms represented by $R^8$ include a butyl group, a pentyl group, a hexyl group, a heptyl group, an octyl group, a nonyl group, a decyl group, an undecyl group, a dodecyl group (it may be called a lauryl group), a tridecyl group, a tetradecyl group, a pentadecyl group, a hexadecyl group, a heptadecyl group, an octadecyl group, a nonadecyl group, and an eicosyl group. These groups may be a straight chain one or a branched chain one.

From the viewpoint of more improving the sensitivity, the resolution and the heat shock resistance, it is preferable that $R^8$ in the formula (4) is an alkyl group having 4 to 16 carbon atoms; an alkyl group having 4 to 12 carbon atoms is more preferable; and an alkyl group having 4 carbon atoms (n-butyl group) is still more preferable.

Examples of monomers imparting a structural unit represented by the formula (4) include alkyl(meth)acrylates. An example of the alkyl(meth)acrylates includes a compound represented by the following formula (12):

$$CH_2=C(R^7)-COOR^8 \quad (12)$$

wherein $R^7$ represents a hydrogen atom or a methyl group; and $R^8$ represents an alkyl group having 4 to 20 carbon atoms.

Examples of monomers represented by the formula (12) include butyl(meth)acrylate, pentyl(meth)acrylate, hexyl (meth)acrylate, heptyl(meth)acrylate, octyl(meth)acrylate, nonyl(meth)acrylate, decyl(meth)acrylate, undecyl(meth) acrylate, dodecyl(meth)acrylate (it may be called lauryl (meth)acrylate), tridecyl(meth)acrylate, tetradecyl(meth) acrylate, pentadecyl(meth)acrylate, hexadecyl(meth) acrylate, heptadecyl(meth)acrylate, octadecyl(meth) acrylate, nanodecyl(meth)acrylate, and eicosyl(meth) acrylate. These polymerizable monomers are used singly or in a combination of two or more. Among these, from the viewpoint of more improving the elongation at break and more decreasing the elastic modulus, it is preferable that there is used butyl(meth)acrylate, pentyl(meth)acrylate, hexyl(meth)acrylate, heptyl(meth)acrylate, octyl(meth)acrylate, nonyl(meth)acrylate, decyl(meth)acrylate, undecyl(meth) acrylate, or dodecyl(meth)acrylate (it may be called lauryl (meth)acrylate).

In the case where (D) an acryl resin has a structural unit represented by the formula (4), it is preferable that the proportion of the structural unit represented by the formula (4) is 50 to 93 mol % with respect to the total amount of the (D) component; 55 to 85 mol % is more preferable; and 60 to 80 mol % is still more preferable. When the proportion of the structural unit represented by the formula (4) is 50 to 93 mol %, the heat shock properties of a patterned cured film can be improved more.

It is preferable that a (D) component is the acryl resin further having a structural unit represented by the following formula (5):

[Chemical Formula 20]

(5)

wherein R⁹ represents a hydrogen atom or a methyl group.

When a (D) component has a structural unit represented by the formula (5), the sensitivity can be improved more.

Monomers imparting a structural unit represented by the formula (5) include acrylic acid and methacrylic acid.

In the case where (D) an acryl resin has a structural unit represented by the formula (5), it is preferable that the proportion of the structural unit represented by the formula (5) is 5 to 35 mol % with respect to the total amount of the (D) component; 10 to 30 mol % is more preferable; and 15 to 25 mol % is still more preferable. When the compositional ratio of structural unit represented by the formula (5) is 5 to 35 mol %, the compatibility with an (A) component and the developability can be improved more.

A (D) component is obtained by blending, for example, a monomer imparting a structural unit represented by the above formula (2), and monomers imparting structural units represented by the formula (3), (4) and (5), which are added as required, and stirring and as required, heating the blend in a solvent such as ethyl lactate, toluene or isopropanol.

Monomers to be used for the synthesis of (D) an acryl resin may further include monomers other than the monomers imparting the structural units represented by the formulae (2), (3), (4) and (5).

Examples of such monomers include benzyl(meth)acrylate, 4-methylbenzyl(meth)acrylate, acrylonitrile, esters of vinyl alcohols such as vinyl-n-butyl ether, tetrahydrofurfuryl (meth)acrylate, glycidyl(meth)acrylate, 2,2,2-trifluoroethyl (meth)acrylate, 2,2,3,3-tetrafluoropropyl(meth)acrylate, α-bromo(meth)acrylic acid, α-chloro(meth)acrylic acid, β-furyl(meth)acrylic acid, β-styryl(meth)acrylic acid, maleic acid, maleic anhydride, maleate monoesters such as and monomethyl maleate, monoethyl maleate and monoisopropyl maleate, fumaric acid, cinnamic acid, α-cyanocinnamic acid, itaconic acid, crotonic acid, and propiolic acid. These monomers are used singly or in a combination of two or more.

It is preferable that the weight-average molecular weight of a (D) component is 2000 to 100000; 3000 to 60000 is more preferable; and 5000 to 50000 is still more preferable, and 10000 to 40000 is especially preferable. When the weight-average molecular weight is 2000 or higher, the heat shock properties of a cured film can be improved more; and when 100000 or lower, the compatibility with an (A) component and the developability can be improved more. Here, the weight-average molecular weight is a value obtained by a measurement using gel permeation chromatography (GPC) and a conversion using a standard polystyrene calibration curve.

From the viewpoint of the balance among the sensitivity, the resolution, the adherence, the mechanical properties, and the thermal shock resistance, it is preferable that the content of the (D) component is 1 to 50 parts by mass with respect to 100 parts by mass of the (A) component; 3 to 30 parts by mass is more preferable; and 5 to 20 parts by mass is still more preferable.

<(E) Component>

A photosensitive resin composition according to the present embodiment may contain a phenolic low molecular weight compound as an (E) component. Thereby, while the dissolution inhibition of unexposed portions of a resin film to an alkali developing solution is maintained, the dissolution speed can be promoted. It is preferable that an (E) component has about 3 to 4 benzene rings in its molecule, and it is preferable that the molecular weight is 200 to 990. Here, the (E) component is different from an (A) component or a (C) component.

From the viewpoint of the dissolution contrast to an alkali developing solution, it is preferable that an (E) component is a compound represented by one of the following formulae (13) to (15). Among these, it is more preferable that an (E) component is a compound represented by the following formula (14):

[Chemical Formula 21]

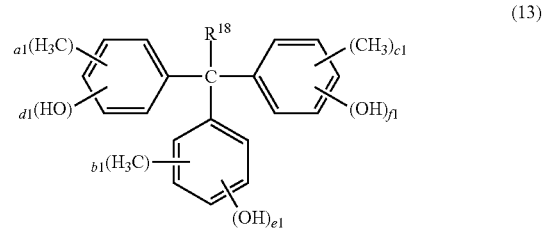

(13)

wherein R¹⁸ represents a hydrogen atom or a methyl group; and a1 to f1 represent an integer of 0 to 3, the total of d1 to f1 is 1 or more, the total of a1 and d1 is 5 or less, the total of b1 and e1 is 5 or less, and the total of c1 and f1 is 5 or less,

[Chemical Formula 22]

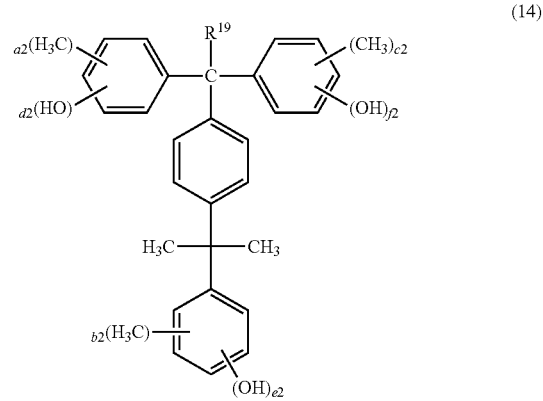

(14)

wherein R¹⁹ represents a hydrogen atom or a methyl group; and a2 to c2 represent an integer of 0 to 3, d2 to f2 represent an integer of 1 to 3, the total of a2 and d2 is 5 or less, the total of b2 and e2 is 5 or less, and the total of c2 and f2 is 5 or less, or

[Chemical Formula 23]

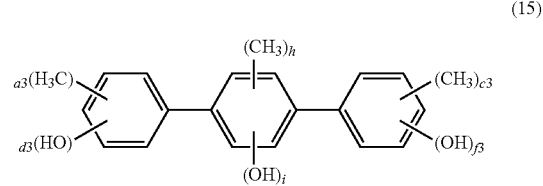

(15)

wherein a3, c3, h and i represent an integer of 0 to 3, d3 and f3 represent an integer of 1 to 3, the total of a3 and d3 is 5 or less, the total of c3 and f3 is 5 or less, and the total of h and i is 4 or less.

Examples of compounds represented by the formula (13) include 1,1,1-tris(4-hydroxyphenyl)methane, 1,1,1-tris(4-hydroxyphenyl)ethane, 1,1-bis(3,5-dimethyl-4-hydroxyphenyl)-1-(4-hydroxyphenyl)methane, 1,1-bis(2,3,5-trimethyl-4-hydroxyphenyl)-1-(2-hydroxyphenyl)methane, 1,1,1-tris (3-methyl-4-hydroxyphenyl)ethane, 1,1-bis(3-methyl-4-hydroxyphenyl)-1-(4-hydroxyphenyl)methane, 1,1-bis(3,5-dimethyl-4-hydroxyphenyl)-1-(3-hydroxyphenyl)methane, 1,1-bis(4,6-dimethyl-2-hydroxyphenyl)-1-(4-hydroxyphenyl)methane, 1,1-bis(3,4,6-trimethyl-2-hydroxyphenyl)-1-(2-hydroxyphenyl)methane, 1,1-bis(2,3,5-trimethyl-4-hydroxyphenyl)-1-(3-hydroxyphenyl)methane, 1,1-bis(2,3,5-trimethyl-4-hydroxyphenyl)-1-(4-hydroxyphenyl)methane, 1,1-bis(3-methyl-4-hydroxyphenyl)-1-(2-hydroxyphenyl)methane, bis(2,5-dimethyl-4-hydroxyphenyl)-2-hydroxyphenylmethane, bis(3,5-dimethyl-4-hydroxyphenyl)-2-hydroxyphenylmethane, 1,1-bis(3-methyl-4-hydroxyphenyl)-1-(3,4-dihydroxyphenyl)methane, 1,1-bis(3,5-dimethyl-4-hydroxyphenyl)-1-(3,4-dihydroxyphenyl)methane, 1,1-bis (2,3,5-trimethyl-4-hydroxyphenyl)-1-(3,4-hydroxyphenyl) methane, 1,1-bis(4-hydroxyphenyl)-1-(3,4-dihydroxyphenyl)methane, 1,1-bis(4-hydroxyphenyl)-1-(2-hydroxyphenyl)methane, 1,1-bis(2-methyl-4-hydroxyphenyl)-1-(2-hydroxyphenyl)methane, 1,1-bis(4,6-dimethyl-2-hydroxyphenyl)-1-(3-hydroxyphenyl)methane, 1,1-bis(3,4,6-trimethyl-2-hydroxyphenyl)-1-(3-hydroxyphenyl)methane, 1,1-bis(3,4,6-trimethyl-2-hydroxyphenyl)-1-(4-hydroxyphenyl)methane, 1,1-bis(4,6-dimethyl-4-hydroxyphenyl)-1-(3,4-dihydroxyphenyl)methane, 1,1-bis(3,4,6-trimethyl-2-hydroxyphenyl)-1-(3,4-dihydroxyphenyl) methane, 1,1-bis(5-methyl-2,3-dihydroxyphenyl)-1-(2-hydroxyphenyl)methane, 1,1-bis(4-hydroxyphenyl)-1-benzylethane, 1,1-bis(4-hydroxyphenyl)-1-benzylmethane, 1-(4-hydroxyphenyl)-1-(3,4-dihydroxyphenyl)-1-benzylethane, 1,1-bis(3-methyl-4-hydroxyphenyl)-1-benzylethane, 1,1-bis(2,3,5-trimethyl-4-hydroxyphenyl)-1-benzylmethane, 1,1-bis(2,3,6-trimethyl-4-hydroxyphenyl)-1-(4-methylbenzyl)methane, and 1,1-bis(2,3,5-trimethyl-4-hydroxyphenyl)-1-(4-methylbenzyl)methane. These compounds can be used singly or in a combination of two or more.

Examples of compounds represented by the formula (14) include 1,1-bis(4-hydroxyphenyl)-1-[4-{1-(4-hydroxyphenyl)-1-methylethyl}phenyl]ethane, 1,1-bis(3,5-dimethyl-4-hydroxyphenyl)-1-[4-{1-(3,5-dimethyl-4-hydroxyphenyl)-1-methylethyl}phenyl]ethane and 1,1-bis(3-methyl-4-hydroxyphenyl)-1-[4-{1-(3-methyl-4-hydroxyphenyl)-1-methylethyl}phenyl]ethane. These compounds can be used singly or in a combination of two or more.

Examples of compounds represented by the formula (15) include 1-(3-methyl-4-hydroxyphenyl)-4-(4-hydroxyphenyl)benzene, 1-(3,5-dimethyl-4-hydroxyphenyl)-4-(4-hydroxyphenyl)benzene, 1,4-bis(3,5-dimethyl-4-hydroxyphenyl)benzene, and 1,4-bis(2,3,5-trimethyl-4-hydroxyphenyl) benzene. These compounds can be used singly or in a combination of two or more.

From the viewpoint of suppressing residues after the development and suppressing the pattern melt in heat curing, it is preferable that the content of an (E) component is 1 to 40 parts by mass with respect to 100 parts by mass of an (A) component; 3 to 35 parts by mass is more preferable; and 5 to 30 parts by mass is still more preferable.

<Other Components>

A photosensitive resin composition according to the present embodiment may contain, other than the above (A) to (E), components including a solvent, an elastomer, a compound that generates an acid by heating, a dissolution promoter, a dissolution inhibitor, a coupling agent, and a surfactant or a leveling agent.

(Solvent)

When a photosensitive resin composition according to the present embodiment contains a solvent, there is attained the effect of making coating on a substrate to be easy and being able to form a coated film having a uniform thickness. Examples of the solvent include γ-butyrolactone, ethyl lactate, propylene glycol monomethyl ether acetate, benzyl acetate, n-butylacetate, ethoxyethylpropionate, 3-methylmethoxypropionate, N-methyl-2-pyrrolidone, N,N-dimethylformamide, N,N-dimethylacetamide, dimethylsulfoxide, hexamethylphosphorylamide, tetramethylenesulfone, diethylketone, diisobutylketone, methylamylketone, cyclohexanone, propyleneglycolmonomethyl ether, propyleneglycolmonopropyl ether, propyleneglycolmonobutyl ether and dipropyleneglycolmonomethyl ether. These solvents can be used singly or in a combination of two or more. Among these, from the viewpoint of the dissolvability and the uniformity of a coated film, it is preferable that ethyl lactate or propylene glycol monomethyl ether acetate is used.

(Elastomer)

As the elastomer, conventionally well-known ones can be used, but it is preferable that the glass transition temperature (Tg) of a polymer constituting an elastomer is 20° C. or lower.

Examples of such an elastomer include styrene-based elastomers, olefin-based elastomers, urethane-based elastomers, polyester-based elastomers, polyamide-based elastomers, and silicone-based elastomers. The elastomer may be microparticulate elastomers. These elastomers can be used singly or in a combination of two or more.

In the case where an elastomer is used, it is preferable that the content thereof is 1 to 60 parts by mass with respect to 100 parts by mass of an (A) component; 3 to 40 parts by mass is more preferable; and 5 to 30 parts by mass is still more preferable.

(Compound that Generates an Acid by Heating)

By using a compound that generates an acid by heating, the acid is enabled to be generated when a patterned resin film is heated, and a reaction of an (A) component and a (C) component, that is, a thermal crosslinking reaction is promoted and the heat resistance of the patterned resin film is improved. Further since the compound that generates the acid by heating generates the acid also by light irradiation, the dissolvability of exposed portions to an alkali aqueous solution increases. Therefore, the difference in the dissolvability to an alkali aqueous solution between unexposed portions and exposed portions becomes further large, more improving the resolution.

It is preferable that such a compound that generates an acid by heating is one to generate the acid, for example, by heating up to 50 to 250° C. Specific examples of a compound that generates an acid by heating include salts formed from a strong acid and a base, such as onium salts, and imidosulfonates.

In the case where a compound that generates an acid by heating is used, it is preferable that the content of the compound is 0.1 to 30 parts by mass with respect to 100 parts by mass of an (A) component; 0.2 to 20 parts by mass is more preferable; and 0.5 to 10 parts by mass is still more preferable.

(Dissolution Promoter)

By blending a dissolution promoter in the above-mentioned positive photosensitive resin composition, the dissolution speed of exposed portions when the photosensitive resin composition is developed with an alkali aqueous solution can be increased and the sensitivity and the resolution can be improved. As the dissolution promoter, conventionally well-known ones can be used. Specific examples thereof include compounds having a carboxyl group, sulfonic acid or a sulfoneamide group.

In the case where such a dissolution promoter is used, the content of the dissolution promoter can be determined by the dissolution speed to an alkali aqueous solution, and made to be 0.01 to 30 parts by mass with respect to 100 parts by mass of the (A) component.

(Dissolution Inhibitor)

A dissolution inhibitor is a compound to inhibit the solubility of an (A) component to an alkali aqueous solution, and is used in order to control the remaining film thickness, the development time and the contrast. Specific examples include diphenyliodonium nitrate, bis(p-tert-butylphenyl)iodonium nitrate, diphenyliodonium bromide, diphenyliodonium chloride, and diphenyliodonium iodide. In the case where a dissolution inhibitor is used, from the viewpoint of the sensitivity and the allowable width of the development time, it is preferable that the content of the dissolution inhibitor is 0.01 to 20 parts by mass with respect to 100 parts by mass of the (A) component; 0.01 to 15 parts by mass is more preferable; and 0.05 to 10 parts by mass is still more preferable.

(Coupling Agent)

By blending a coupling agent in a photosensitive resin composition, the adhesion of a patterned cured film to be formed with a substrate can be more raised. Examples of the coupling agent include organosilane compounds and aluminum chelate compounds. An example of the organosilane compound includes ureapropyltrimethoxysilane.

In the case where a coupling agent is used, it is preferable that the content thereof is 0.1 to 20 parts by mass with respect to 100 parts by mass of an (A) component; and 0.5 to 10 parts by mass is more preferable.

(Surfactant or Leveling Agent)

By blending a surfactant or a leveling agent in a photosensitive resin composition, the applicability can be improved more. Specifically, for example, containing a surfactant or a leveling agent can prevent the striation (unevenness of the film thickness) more, and can improve the developability more. Examples of such a surfactant or leveling agent include polyoxyethylene lauryl ether, polyoxyethylene stearyl ether, polyoxyethylene oleyl ether, and polyoxyethylene octylphenol ether. Examples of commercially available products include Megaface F171, F173, R-08 (trade name, made by Dainippon Ink and Chemicals, Inc.), Fluorad FC430, FC431 (trade name, made by Sumitomo 3M Ltd.), and Organosiloxane Polymer KP341, KBM303, KBM403, and KBM803 (trade name, made by Shin-Etsu Chemical Co., Ltd.).

In the case where a surfactant or a leveling agent is used, it is preferable that the content is 0.001 to 5 parts by mass with respect to 100 parts by mass of the (A) component; and 0.01 to 3 parts by mass is more preferable.

A photosensitive resin composition according to the present embodiment is capable of being developed using an alkali aqueous solution of tetramethylammonium hydroxide (TMAH) or the like. Further by using the above-mentioned photosensitive resin composition according to the present embodiment, a patterned cured film having a sufficiently high sensitivity and resolution, and the good adherence and heat shock properties is enabled to be formed.

[Patterned Cured Film and a Method for Producing the Patterned Cured Film]

A patterned cured film according to the present invention can be obtained by heating a photosensitive resin composition.

Then, a method for producing a patterned cured film will be described. A method for producing a patterned cured film comprises a step (applying and drying (film forming) step) of applying and drying a photosensitive resin composition according to the present embodiment on a part or the whole surface of a substrate to thereby form a resin film, a step (exposing step) of exposing a part or the whole surface of the resin film, a step (developing step) of developing the resin film after the exposure with an alkali aqueous solution to thereby form a patterned resin film, and a step (heat treating step) of heating the patterned resin film.

<Applying and Drying (Film Forming) Step>

First, a photosensitive resin composition according to the present embodiment is applied and dried on a substrate to thereby form a resin film. In this step, first, a photosensitive resin composition according to the present embodiment is rotationally applied on a substrate of a glass, a semiconductor, a metal oxide insulator (for example, $TiO_2$, $SiO_2$), a silicon nitride or the like by using a spinner or the like to thereby form a coated film. The thickness of the coated film is not especially limited, but it is preferable that the thickness is 0.1 to 40 μm. The substrate on which the coated film has been formed is dried by using a hot plate, an oven or the like. The drying temperature and the drying time are not especially limited, but it is preferable that the drying is carried out at 80 to 140° C. for 1 to 7 min. Thereby, a photosensitive resin film is formed on the support substrate. The thickness of the photosensitive resin film is not especially limited, but 0.1 to 40 μm is preferable.

<Exposing Step>

Then, in the exposing step, the resin film formed on the substrate is irradiated with active light rays such as ultraviolet rays, visible light rays and radiation through a mask. In the photosensitive resin composition according to the present embodiment, since the (A) component is high in transparency to i-line, the irradiation of i-line can suitably be used. After the exposure, as required, post-exposure baking (PEB) may be carried out from the viewpoint of improving the dissolution speed. In the case where the post-exposure baking is carried out, it is preferable that the temperature thereof is 70° C. to 140° C., and that the time thereof is 1 min to 5 min.

<Development Step>

In the development step, exposed portions of the resin film after the exposure step are removed by a developing solution to thereby pattern the resin film to obtain a patterned resin film. As the developing solution, an alkali aqueous solution, for example, of sodium carbonate, sodium hydroxide, potassium hydroxide, sodium silicate, ammonia, ethylamine, diethylamine, triethylamine, triethanolamine and tetramethylammonium hydroxide (TMAH), is suitably used. It is preferable that the concentration of a base of the aqueous solution is 0.1 to 10 mass %. Alcohols or a surfactant may further be added to the developing solution and used. It is preferable that each thereof can be blended in the range of 0.01 to 10 parts by mass with respect to 100 parts by mass of the developing solution; and the range of 0.1 to 5 parts by mass thereof is more preferable. A method of development using a developing solution involves, for example, distributing the developing solution on the photosensitive resin film by a method such as a shower development, a spray development, an immersion development or a paddle development, and leaving it to stand under the condition of 18 to 40° C. for 30 to 360 sec. The patterned resin film is washed by water washing and spin drying after the being left.

<Heat Treating Step>

Then, in the heat treating step, by heat treating the patterned resin film, a patterned cured film can be formed. From the viewpoint of preventing damage due to heat to semiconductor apparatuses, it is preferable that the heating temperature in the heat treating step is 250° C. or lower; 225° C. or lower is more preferable; and 140 to 200° C. is still more preferable.

The heat treatment can be carried out, for example, using an oven such as a quartz tube oven, a hot plate, a rapid thermal annealer, a vertical diffusion oven, an infrared curing oven, an electron-beam curing oven, a microwave curing oven. Although the atmosphere for the heat treatment can be selected from either of the air and an inert atmosphere such as nitrogen, it is desirable that the heat treatment is carried out in nitrogen, because of being able to prevent the oxidation of the pattern. Since the above-mentioned preferable range of the heating temperature is lower than conventional heating temperatures, the damage to support substrates and semiconductor apparatuses can be suppressed small. Therefore, by using the producing method of a resist pattern according to the present embodiment, electronic devices can be produced in a high yield. The heating temperature leads to the energy saving of the process. The use of the positive photosensitive resin composition according to the present embodiment, since the volume shrinkage (curing shrinkage) in the heat treatment step, as would be seen in the use of photosensitive polyimide and the like, is low, can further prevent the decrease in the dimensional accuracy.

The heat treatment time in the heat treatment step suffices if being a time enough to cure the positive photosensitive resin composition, but about 5 hours or shorter is preferable in the balance with the working efficiency.

The heat treatment can also be carried out by using, in addition to the above-mentioned ovens, a microwave curing apparatus or a frequency-variable microwave curing apparatus. The use of these apparatuses allows effective heating of a photosensitive resin film alone with the temperature of substrates and semiconductor apparatuses being held, for example, at 200° C. or lower (see J. Photopolym. Sci. Technol., 18, 327-332 (2005)).

According to the above-mentioned method for producing a patterned cured film according to the present embodiment, the patterned cured film having a sufficiently high sensitivity and resolution, and the excellent adherence and heat shock properties can be obtained.

[Interlayer Insulating Layer, Surface Protecting Layer]

The patterned cured film obtained by the method for producing a patterned cured film according to the present embodiment can be used as an interlayer insulating layer or a surface protecting layer of a semiconductor element.

[Semiconductor Element]

A semiconductor element according to the present embodiment has the interlayer insulating layer or the surface protecting layer according to the present embodiment. The semiconductor element according to the present embodiment is not especially limited, but refers to a memory, a package and the like having a multilayer wiring structure, a rewiring structure and the like.

Here, one example of a producing step of a semiconductor element will be described based on the drawings. FIGS. 1 to 5 are schematic perspective views and schematic end views illustrating one embodiment of the producing step of a semiconductor element having a multilayer wiring structure. In FIGS. 1 to 5, (a) are schematic perspective views, and (b) are schematic perspective views illustrating Ib-Ib to Vb-Vb end surfaces in the corresponding (a).

First, a structural body 100 shown in FIG. 1 is prepared. The structural body 100 comprises a semiconductor substrate 1 such as a Si substrate having circuit elements, a protecting film 2 such as a silicon oxide film having a predetermined pattern where the circuit elements are exposed and covering the semiconductor substrate 1, a first conductor layer 3 formed on the exposed circuit elements, and an interlayer insulating layer 4 formed as a film on the protecting film 2 and the first conductor layer 3 by a spin coat method or the like and composed of a polyimide resin or the like.

Figure 2:
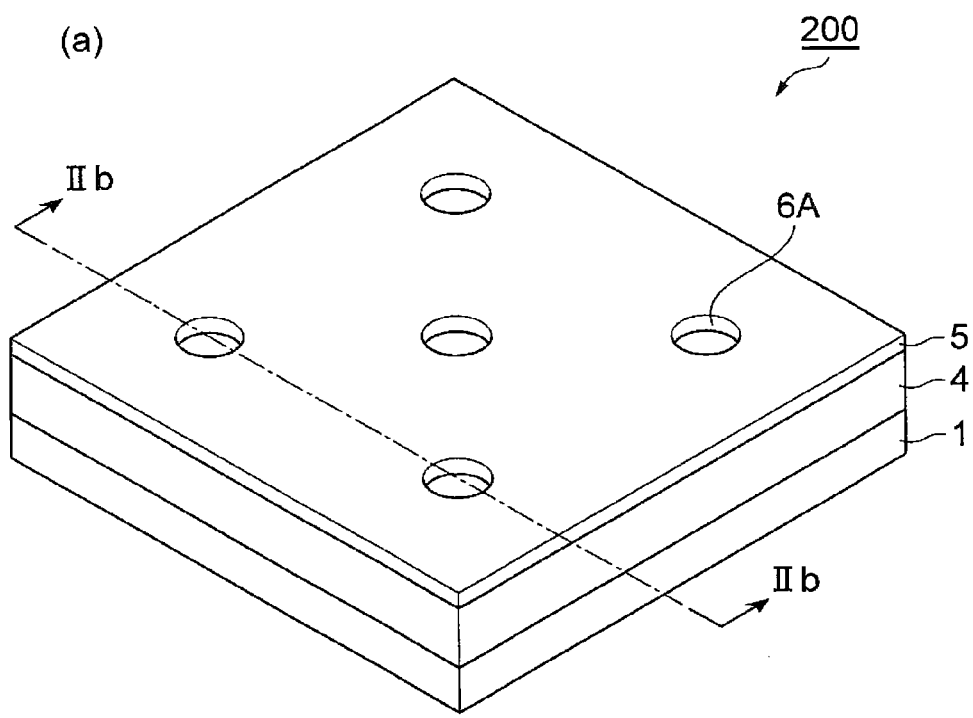
FIG. 2a is a schematic perspective view and FIG. 2b is a schematic end view illustrating one embodiment of a producing process of the semiconductor element.
Figure 2:
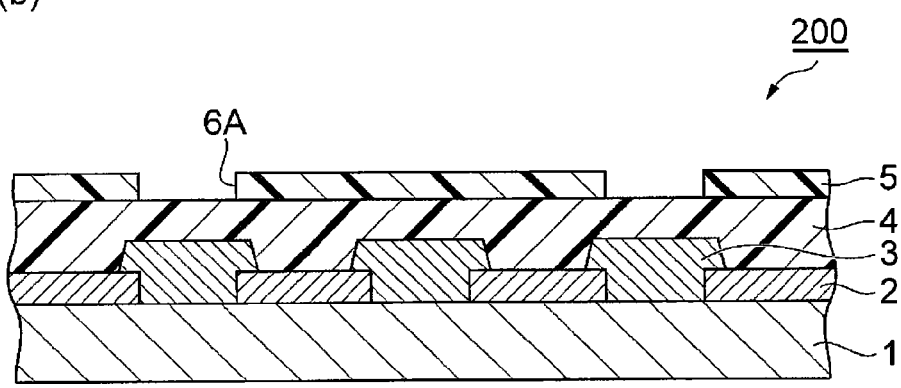

Then, a photosensitive resin layer 5 having window parts 6A is formed on the interlayer insulating layer 4 to thereby obtain a structural body 200 shown in FIG. 2. The photosensitive resin layer 5 is formed by applying a photosensitive resin such as a chlorinated rubber-based, a phenol novolac-based, a polyhydroxystyrene-based or a polyacrylate ester-based one, by a spin coat method. The window parts 6A are formed by a well-known photo-lithographic technology so that predetermined portions of the interlayer insulating layer 4 are exposed.

Figure 3:
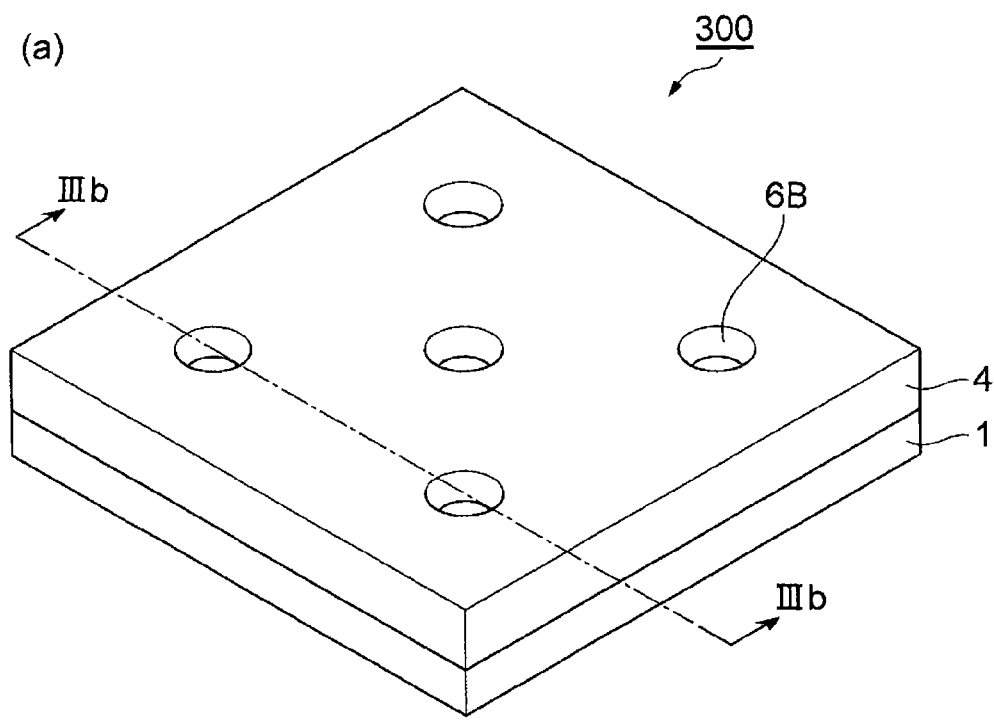
FIG. 3a is a schematic perspective view and FIG. 3b is a schematic end view illustrating one embodiment of a producing process of the semiconductor element.
Figure 3:
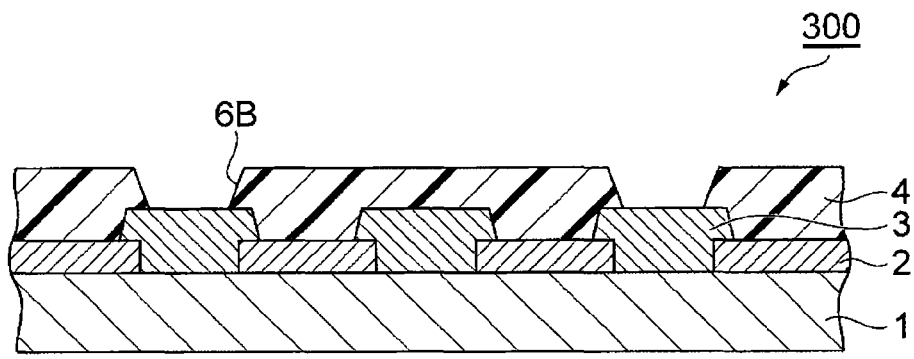

The interlayer insulating layer 4 is etched to thereby form window parts 6B, and thereafter, the photosensitive resin layer 5 is removed to thereby obtain a structural body 300 shown in FIG. 3. The etching of the interlayer insulating layer 4 can use dry etching means using a gas such as oxygen or carbon tetrafluoride. By this etching, portions of the interlayer insulating layer 4 corresponding to the window parts 6A are selectively removed to thereby obtain the interlayer insulating layer 4 provided with the window parts 6B so that the first conductor layer 3 is exposed. Then, the photosensitive resin layer 5 is removed using an etching solution which does not corrode the first conductor layer 3 exposed from the window parts 6B, but corrodes the photosensitive resin layer 5 only.

Figure 4:
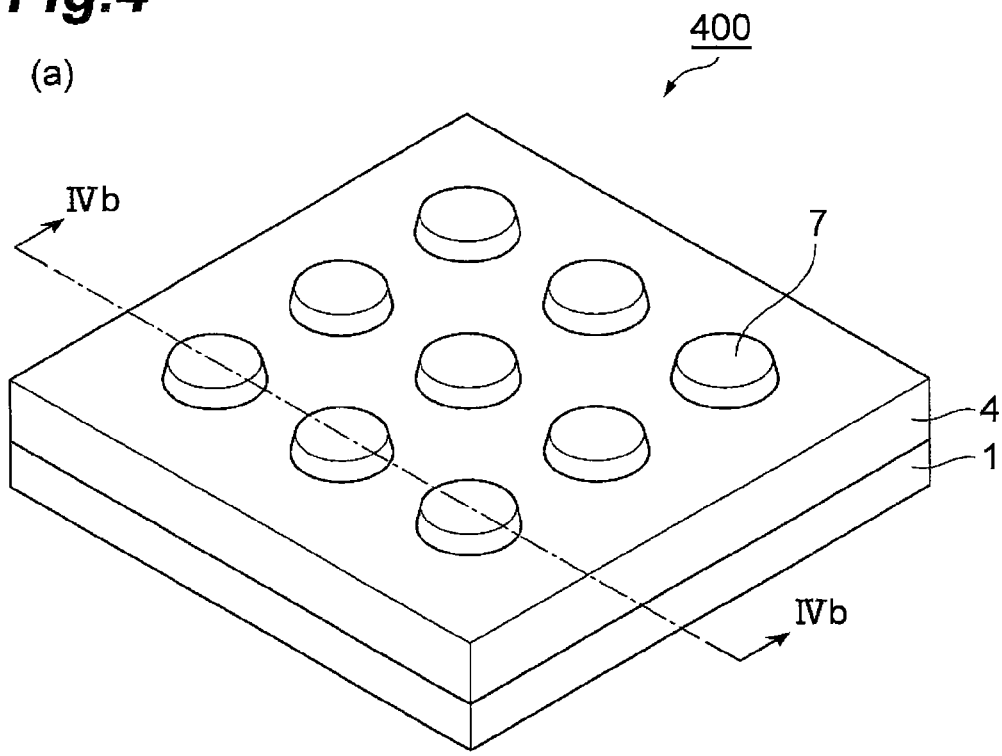
FIG. 4a is a schematic perspective view and FIG. 4b is a schematic end view illustrating one embodiment of a producing process of the semiconductor element.
Figure 4:
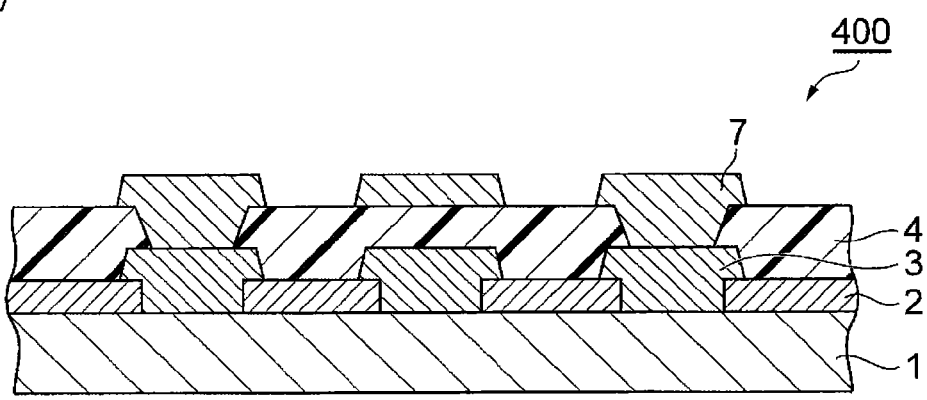

A second conductor layer 7 is further formed on portions corresponding to the window parts 6B to thereby obtain a structural body 400 shown in FIG. 4. The formation of the second conductor layer 7 can use a well-known photo-lithographic technology. The second conductor layer 7 and the first conductor layer 3 are thereby electrically connected.

Figure 5:
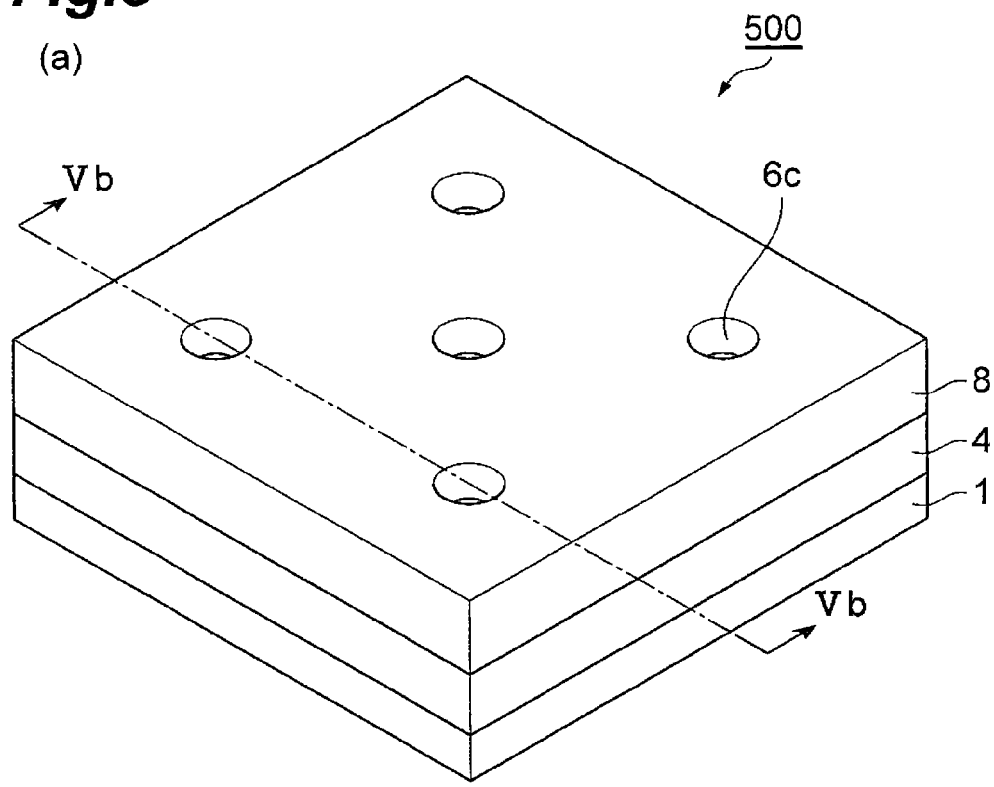
FIG. 5a is a schematic perspective view and FIG. 5b is a schematic end view illustrating one embodiment of a producing process of the semiconductor element.
Figure 5:
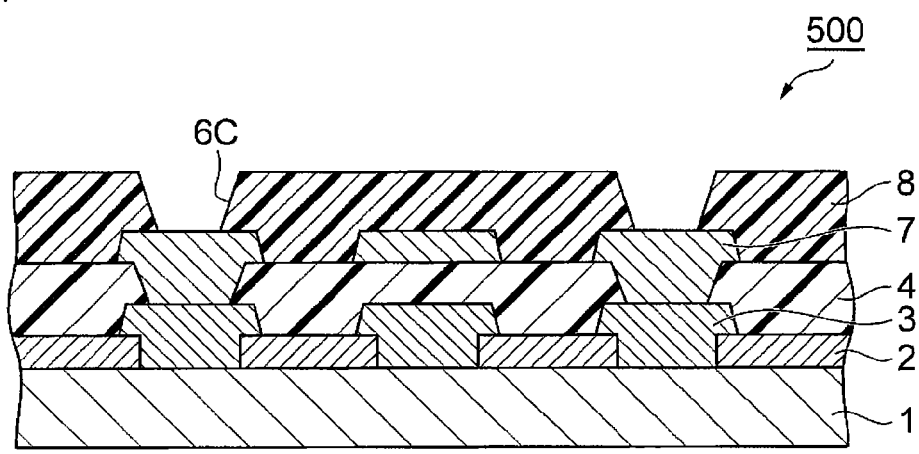

Finally, a surface protecting layer 8 is formed on the interlayer insulating layer 4 and the second conductor layer 7 to thereby obtain a semiconductor element 500 shown in FIG. 5. In the present embodiment, the surface protecting layer 8 is formed as follows. First, the above-mentioned photosensitive resin composition is applied on the interlayer insulating layer 4 and the second conductor layer 7 by a spin coat method, and dried to thereby form a photosensitive resin film. Then, light irradiation is carried out through a mask on whose predetermined portions a pattern corresponding to window parts 6C is drawn, and thereafter, the resin film after the exposure is developed with an alkali aqueous solution to thereby form a patterned resin film. Thereafter, the patterned resin film is heated to be cured to thereby form a patterned cured film to be used as the surface protecting layer 8. The surface protecting layer 8 protects the first conductor layer 3 and the second conductor layer 7 from stresses, α rays and the like from the outside; and the semiconductor element 500 using the surface protecting layer 8 according to the present embodiment is excellent in the reliability.

In the above-mentioned embodiment, a producing method of a semiconductor element having a two-layer wiring structure was described, but in the case of forming a multilayer wiring structure of two or more layers, the each layer can be formed by repeatedly carrying out the above-mentioned steps. That is, a multilayer pattern is allowed to be formed by repeating the each step of forming the interlayer insulating layer 4 and the each step of forming the surface protecting layer 8. Here, in the above example, not only the surface protecting layer 8 but also the interlayer insulating layer 4 are allowed to be formed using the photosensitive resin composition according to the present embodiment.

An electronic device according to the present embodiment can have, not limited to the structure having a surface protecting layer, a cover coat layer or an interlayer insulating layer formed using the above-mentioned positive photosensitive resin composition, one of various structures.

Figure 6:
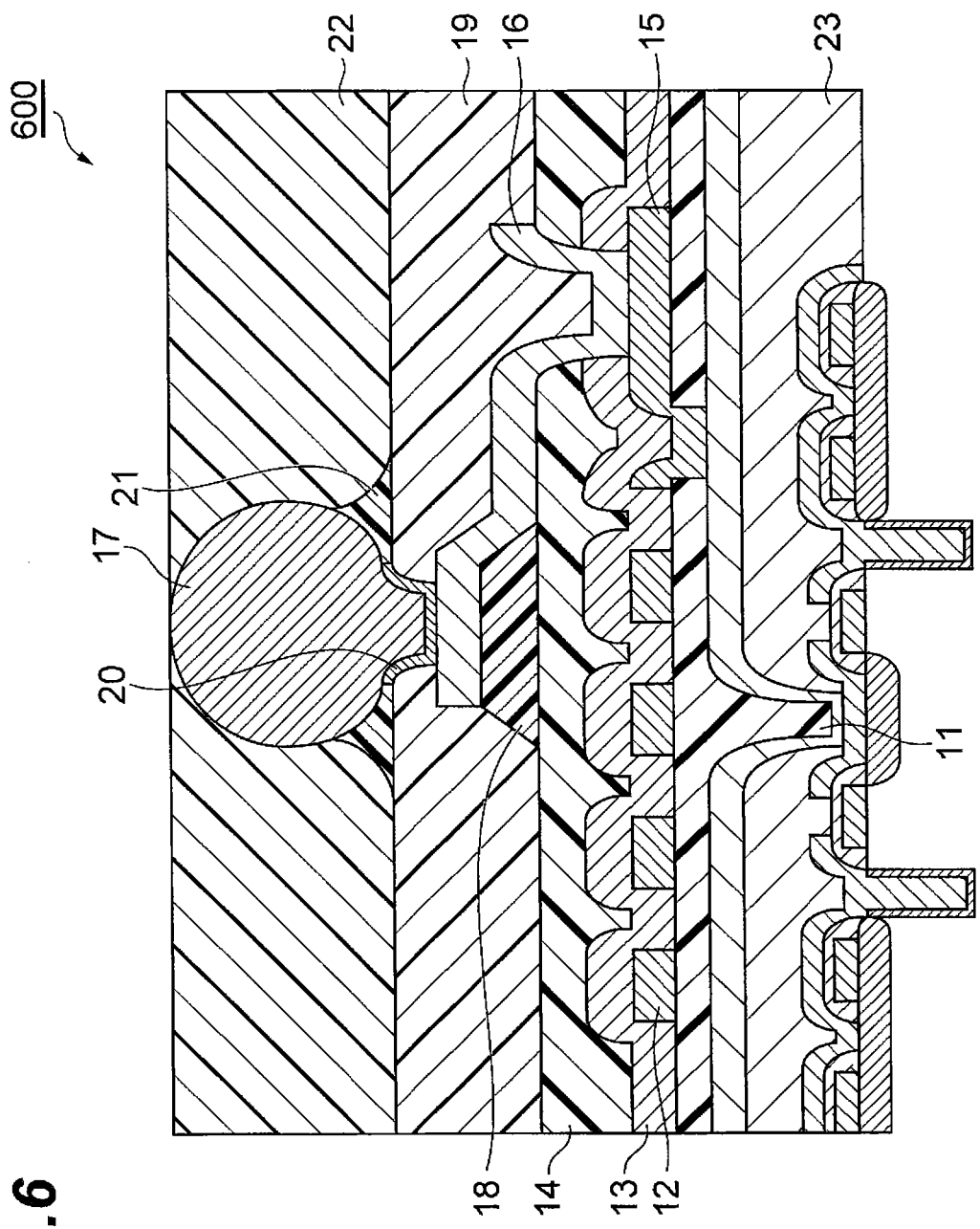
FIG. 6 is a schematic cross-sectional diagram showing one embodiment of semiconductor element.
Figure 7:
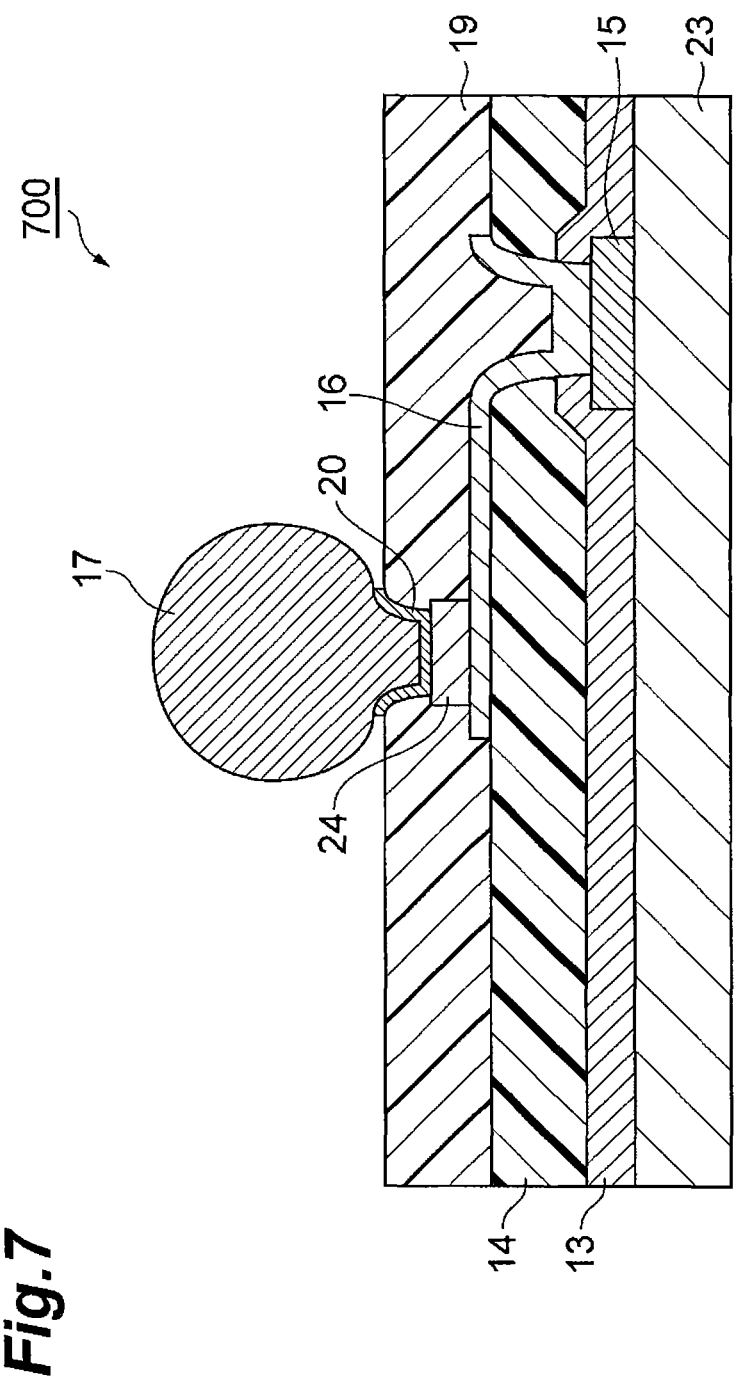
FIG. 7 is a schematic cross-sectional diagram showing one embodiment of semiconductor element.

FIGS. 6 and 7 are schematic cross-sectional views illustrating one embodiment of a semiconductor element having a rewiring structure. The photosensitive resin composition according to the present embodiment, since being excellent in the stress relaxation, the adhesion and the like, can be used in semiconductor elements having a rewiring structure recently developed as shown in FIGS. 6 and 7.

FIG. 6 is a schematic cross-sectional diagram showing a wiring structure as one embodiment of a semiconductor element. The semiconductor element 600 shown in FIG. 6 comprises a silicon substrate 23, an interlayer insulating layer 11 provided on one surface side of the silicon substrate 23, an Al wiring layer 12 formed on the interlayer insulating layer 11 and having a pattern containing a pad portion 15, an insulating layer 13 (for example, P—SiN layer) and a surface protecting layer 14 successively stacked on the interlayer insulating layer 11 and the Al wiring layer 12 while an opening is formed on the pad portion 15, an island-shaped core 18 disposed in the vicinity of the opening on the surface protecting layer 14, and a rewiring layer 16 extending on the surface protecting layer 14 so as to contact with the pad portion 15 in the opening of the insulating layer 13 and the surface protecting layer 14 and to contact with a surface of the core 18 on the opposite side thereof to the surface protecting layer 14. Further, the semiconductor element 600 further comprises a cover coat layer 19 formed covering the surface protecting layer 14, the core 18 and the rewiring layer 16 and having an opening formed on a portion of the rewiring layer 16 on the core 18, a conductive ball 17 connected with the rewiring layer 16 through a barrier metal 20 interposed therebetween in the opening of the cover coat layer 19, a collar 21 holding the conductive ball, and an underfill 22 provided on the cover coat layer 19 around the conductive ball 17. The conductive ball 17 is used as an external connection terminal, and is formed of a solder, gold or the like. The underfill 22 is provided in order to relax the stress when the semiconductor element 600 is mounted.

In the semiconductor element 700 of FIG. 7, an Al wiring layer (not shown in figure) and a pad portion 15 of the Al wiring layer are formed on a silicon substrate 23; an insulating layer 13 is formed on the lower part thereof; and a surface protecting layer 14 for elements is further formed. A rewiring layer 16 is formed on the pad portion 15; and the rewiring layer 16 extends up to the upper part of a connection part 24 with a conductive ball 17. A cover coat layer 19 is further formed on the surface protecting layer 14. The rewiring layer 16 is connected with the conductive ball 17 through a barrier metal 20.

In the semiconductor elements of FIGS. 6 and 7, the photosensitive resin composition can be used as a material not only for forming the interlayer insulating layer 11 and the surface protecting layer 14, but also for forming the cover coat layer 19, the core 18, the collar 21, the underfill 22, and the like. Since a patterned cured film using the photosensitive resin composition according to the present embodiment is excellent in the adhesion with a metal layer such as the Al wiring layer 12 or the rewiring layer 16, and high in the stress relaxation effect, a semiconductor element using the patterned cured film for the interlayer insulating layer 11, the surface protecting layer 14, the cover coat layer 19, the core 18, the collar 21 of a solder or the like, the underfill 22 used in flip chips, and the like becomes remarkably excellent in the reliability.

It is suitable that the photosensitive resin composition according to the present embodiment is used for the interlayer insulating layer 11, the surface protecting layer 14 and/or the cover coat layer 19 of the semiconductor elements having the rewiring layer 16 in FIGS. 6 and 7.

It is preferable that the film thicknesses of the interlayer insulating layer 11, the surface protecting layer 14 and the cover coat layer 19 are 3 to 20 µm; and 5 to 15 µm is more preferable.

[Electronic Device]

An electronic device according to the present embodiment has the semiconductor element according to the present embodiment. The electronic device refers to one containing the above-mentioned semiconductor element, and examples thereof include cell phones, smartphones, tablet computers, personal computers, and hard disc suspensions.

As described hitherto, in the photosensitive resin composition according to the present embodiment, the white turbidity of the photosensitive resin composition is sufficiently suppressed; the haze value of a patterned cured film to be formed is made low; and in the producing step of a semiconductor element after the formation of the patterned cured film, the alignment is easily carried out. Further a patterned cured film formed using the photosensitive resin composition according to the present embodiment is excellent in the mechanical properties and low in the changing rates of mechanical properties after being left at a high temperature and after a thermal shock test. Further the photosensitive resin composition according to the present embodiment can provide a semiconductor element and an electronic device excellent in the reliability.

EXAMPLES

Hereinafter, the present invention will be described specifically based on Examples, but the present invention is not limited thereto.

Materials used in the present Examples will be shown in the below.

[(A) Component]

A1: 100 parts by mass in total of p-t-butoxystyrene and styrene in a molecular ratio of 85:15 was prepared; these were dissolved in 150 parts by mass of propylene glycol monomethyl ether; and the polymerization was carried out in a nitrogen atmosphere at a reaction temperature being held at 70° C., for 10 hours by using 4 parts by mass of azobisisobutyronitrile, under stirring at a stirring rotation frequency of about 160 rpm. Thereafter, sulfuric acid was added to the reaction solution and allowed to react at a reaction temperature being held at 90° C. for 10 hours to thereby deprotect p-t-butoxystyrene and convert it to hydroxystyrene. Ethyl acetate was added to the obtained copolymer; water washing was repeated five times; an ethyl acetate phase was collected, and the solvent was removed to thereby obtain a p-hydroxystyrene/styrene copolymer A1. The weight-average molecular weight (Mw) in terms of polystyrene of the copolymer A1 was 10000. As a result of a $^{13}$C-NMR analysis, the copolymerization molecular ratio of p-hydroxystyrene and styrene was 85:15.

A2: a p-hydroxystyrene homopolymer A2 was obtained as in the synthesis example 1, except for dissolving 100 parts by mass of p-t-butoxystyrene alone in 150 parts by mass of propylene glycol monomethyl ether. The weight-average molecular weight of the homopolymer A2 was 10000.

A3: a copolymer of 4-hydroxystyrene/methyl methacrylate in 50/50 (in molecular ratio)(weight-average molecular weight: 10000, made by Maruzen Petrochemical Co., Ltd., trade name: "Maruka Lyncur CMM").

A'4: a cresol novolac resin (cresol/formaldehyde novolac resin, m-cresol/p-cresol (in molecular ratio): 60/40, weight-average molecular weight: 12000, made by Asahi Organic Chemicals Industry Co., Ltd., trade name: "EP4020G").

Here, the weight-average molecular weights were determined by using gel permeation chromatography (GPC) and a conversion in terms of standard polystyrene.

Specifically, the weight-average molecular weight was measured by the following apparatus under the following condition.

Measuring apparatus: a detector: L4000UV, made by Hitachi, Ltd.; a pump: L6000, made by Hitachi, Ltd.; and C-R4A Chromatopac, made by Shimadzu Corp.

Measuring condition: columns: Gelpack GL-S300MDT-5 (two columns); an eluent: THF, LiBr (0.03 mol/l), H$_3$PO$_4$ (0.06 mold); the flow rate: 1.0 ml/min; the detector: UV 270 nm; and the measurement was carried out using a solution in which a solvent [THF/DMF (in volume ratio): 1/1] was 1 ml with respect to 0.5 mg of a sample.

[(B) Component]

B1: a 1-naphthoquinone-2-diazide-5-sulfonate ester of 1,1-bis(4-hydroxyphenyl)-1-[4-{1-(4-hydroxyphenyl)-1-methylethyl}phenyl]ethane (esterification rate: about 90%, made by AZ Electronic Materials SA, trade name: "TPPA528").

B2: a 1-naphthoquinone-2-diazide-5-sulfonate ester of tris (4-hydroxyphenyl)methane (esterification rate: about 95%).

[(C) Component]

C1: hexakis(methoxymethyl)melamine (made by Sanwa Chemical Co., Ltd., trade name: "Nikalac MW-30HM", a compound represented by the following formula (C1)).

[Chemical Formula 24]

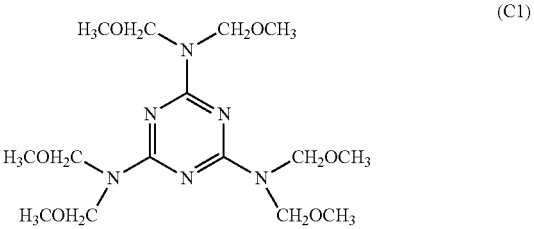

(C1)

C2: 1,1-bis {3,5-bis(methoxymethyl)-4-hydroxyphenyl}methane (made by Honshu Chemical Industry Co., Ltd., trade name: "TMOM-pp-BPF", a compound represented by the following formula (C2)).

[Chemical Formula 25]

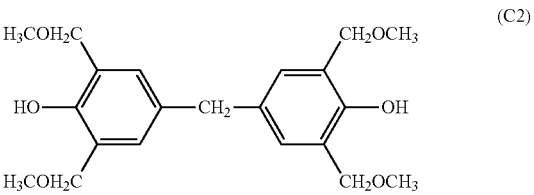

(C2)

[(D) Component]

D1: 55 g of ethyl lactate was weighed in a 100-ml three-necked flask equipped with a stirrer, a nitrogen introducing tube and a thermometer; and separately weighed polymerizable monomers (34.7 g of n-butyl acrylate (BA), 2.2 g of lauryl acrylate (LA), 3.9 g of acrylic acid (AA), 2.6 g of hydroxybutyl acrylate (HBA) and 1.7 g of 1,2,2,6,6-pentamethylpiperidin-4-yl methacrylate (trade name: FA-711MM, made by Hitachi Chemical Co., Ltd.)), and 0.29 g of azobisisobutyronitrile (AIBN) were added. Dissolved oxygen was removed by making nitrogen gas flow at a flow volume of 400 ml/min for 30 min under stirring at a stirring rotation frequency of about 160 rpm at room temperature. Thereafter, the inflow of the nitrogen gas was stopped; and the flask was sealed, and heated to 65° C. over about 25 min in a constant-temperature water bath. The temperature was held for 10 hours to carry out the polymerization reaction to thereby obtain an acryl resin D1. This polymerization rate was 99%. The weight-average molecular weight of the D1 was about 22000. Here, the molecular ratio of the polymerizable monomers in the acryl resin D1 was as follows. BA/LA/AA/HBA/FA711MM=75.5/2.5/15/5/2 (mol %)

D2 to D4, D'5, D6 to D9: acryl resins D2 to D4, D'5, D6 to D9 were synthesized as in the synthesis method of D1, except for using polymerizable monomers in blend amounts indicated in Table 1, respectively. The weight-average molecular weights of the synthesized acryl resins D2 to D4, D'5, D6 to D9 are shown in Table 1.

Here, the weight-average molecular weight of the (D) component was determined by the same method as in the (A) component.

TABLE 1

| Polymerizable Monomer | D1 | D2 | D3 | D4 | D'5 | D6 | D7 | D8 | D9 |
|---|---|---|---|---|---|---|---|---|---|
| FA-711MM | 1.7 g (20 mmol) | 1.7 g (20 mmol) | 1.6 g (20 mmol) | — | 1.7 g (20 mmol) | 1.6 g (20 mmol) | 1.7 g (20 mmol) | 1.7 g (20 mmol) | — |
| BA | 34.7 g (755 mmol) | 32.8 g (730 mmol) | 31.0 g (705 mmol) | 34.3 g (665mmol) | 33.7 g (730 mmol) | 37.1 g (880 mmol) | 31.0 g (680 mmol) | 33.2 g (730 mmol) | — |

TABLE 1-continued

| Polymerizable Monomer | D1 | D2 | D3 | D4 | D'5 | D6 | D7 | D8 | D9 |
|---|---|---|---|---|---|---|---|---|---|
| LA | 2.2 g (25 mmol) | 4.2 g (50 mmol) | 6.2 g (75 mmol) | 4.3 g (50 mmol) | 4.3 g (50 mmol) | 4.0 g (50 mmol) | 4.3 g (50 mmol) | 4.3 g (50 mmol) | — |
| AA | 3.9 g (150 mmol) | 3.8 g (150 mmol) | 3.7 g (150 mmol) | 3.9 g (150 mmol) | 5.2 g (200 mmol) | — | 3.8 g (150 mmol) | 3.8 g (150 mmol) | — |
| HEA | — | — | — | — | — | — | 4.1 g (100 mol) | 2.1 g (50 mmol) | — |
| HBA | 2.6 g (50 mmol) | 2.5 g (50 mmol) | 2.5 g (50 mmol) | 2.6 g (50 mmol) | — | 2.4 g (50 mmol) | — | — | 50.0 g (1000 mmol) |
| Weight-Average Molecular Weight | 22000 | 22000 | 22000 | 32000 | 22000 | 22000 | 22000 | 22000 | 22000 |

FA-711MM: 1,2,2,6,6-pentamethylpiperidin-4-yl methacrylate (made by Hitachi Chemical Co., Ltd.)
BA: n-butyl acrylate
LA: lauryl acrylate
AA: acrylic acid
HEA: hydroxyethyl acrylate
HBA: hydroxybutyl acrylate Examples 1 to 12, and Comparative Examples 1 to 3

(A) to (D) components in blend amounts indicated in Table 2, 120 parts by mass of ethyl lactate as a solvent, and 2 parts by mass of a 50% methanol solution of ureapropyltriethoxysilane as a coupling agent were blended, and the blend was subjected to a pressure filtration using a Teflon® filter of 3 μm in pore to thereby prepare photosensitive resin compositions of Examples 1 to 12 and Comparative Examples 1 to 3.

<Evaluation of the Photosensitive Resin Compositions>

The photosensitive resin compositions of Examples 1 to 12 and Comparative Examples 1 to 3 were evaluated for the following. The results are shown in Table 2.

(Remaining Film Ratio, Sensitivity, and Resolution)

The photosensitive resin compositions obtained in Examples 1 to 12 and Comparative Examples 1 to 3 were each spin coated on the silicon substrate, and heated at 120° C. for 4 min to thereby form a coated film of about 11 to 13 μm in thickness. Then, the coated film was subjected to a reduction projection exposure using the i-line (365 nm) through a mask having square hole patterns of 1 μm×1 μm to 100 μm×100 μm by using an i-line stepper (made by Canon Inc., trade name: "FPA-3000iW"). The exposure was carried out by varying the exposure amount from 100 to 1520 mJ/cm² stepwise by 20 mJ/cm². After the exposure, the coated film was subjected to a development using a 2.38% aqueous solution of tetramethylammonium hydroxide (TMAH). The remaining film ratio of unexposed portions after the development was about 80 to 99% of the film thickness before the development. Then, since the coated film was of a positive photosensitive resin composition, the remaining film ratio did not depend on the exposure amount. Here, the remaining film ratio was calculated by the following expression.

Remaining film ratio (%)=(a film thickness of the coated film after the development/a film thickness of the coated film before the development)×100

Thereafter, the remaining film was rinsed with water; and the minimum exposure amount capable of forming the 100 μm×100 μm square hole pattern was taken as the sensitivity. Further, the size (the length of one side) of a minimum one out of the opened square hole patterns in the above range of the exposure amounts was taken as an index of the resolution. The lower the sensitivity and the resolution, the better. The results are shown in Table 2.

Thereafter, the resist patterns were heat treated (cured) in nitrogen, at a temperature of 200° C. (temperature-rise time: 1.5 hours) for 2 hours by using a vertical diffusion oven (made by Koyo Thermo System Co., Ltd., trade name: "μ-TF"), and the resolution after the curing was measured. The evaluation method was the same as in the resolution before the curing.

(Curing Shrinkage Percentage)

The photosensitive resin compositions obtained in Examples 1 to 12 and Comparative Examples 1 and 3 were each spin coated on the silicon substrate, and heated at 120° C. for 4 min to thereby form a coated film of about 12 to 14 μm in thickness. Thereafter, the coated film was subjected to an exposure in an exposure amount two times the minimum exposure amount in the entire wavelength through a mask by using a proximity aligner (made by Canon Corp., trade name: "PLA-600FA"). After the exposure, the resin film was subjected to a development using a 2.38% aqueous solution of TMAH to thereby obtain a resist pattern of 10 mm in width. Thereafter, the resist pattern was heat treated (cured) in nitrogen at a temperature of 200° C. (temperature-rise time: 1.5 hours) for 2 hours by using a vertical diffusion oven (made by Koyo Thermo System Co., Ltd., trade name: "μ-TF") to thereby obtain a cured film of about 10 μm in thickness. Here, the curing shrinkage percentage was calculated by the following expression.

Curing shrinkage percentage (%)=[1−(a film thickness after curing/a film thickness before curing)]×100

The results are shown in Table 2.

(Elongation at Break after Curing, Elastic Modulus after Curing)

A cured film having the film thickness obtained by the same method as in the above-mentioned evaluation of the curing shrinkage percentage was peeled off the silicon substrate; and the elongation at break (EL) and the elastic modulus (YM) of the peeled-off cured film were measured by Autograph AGS-H100N, made by Shimadzu Corp. The width of the sample was 10 mm; the film thickness was about 10 μm; and the distance between chucks was made to be 20 mm. The tension rate was set at 5 mm/min; and the measurement temperature was made nearly at room temperature (20° C. to 25° C.). Averages of measurement values of 5 test pieces obtained from the cured film obtained in the same condition were taken as the elongation at break after the curing and the elastic modulus after the curing. It is preferable that the elongation at break after the curing is large; and it is more preferable that the elongation is 5% or larger. It is preferable that the elastic modulus after the curing is small; and it is preferable that the elastic modulus is 3 GPa or smaller. The results are shown in Table 2.

(Elongation at Break after being Left at a High Temperature, Elastic Modulus after being Left at a High Temperature)

A cured film of about 10 μm in film thickness obtained by the same method as in the above-mentioned evaluation of the curing shrinkage percentage was left for 1000 hours in a box-type drier (VOS-300VD, made by Tokyo Rikakikai Co., Ltd.) of 150° C., and thereafter peeled off the silicon substrate; and the elongation at break and the elastic modulus of the peeled-off cured film were measured by Autograph AGS-H100N, made by Shimadzu Corp. The width of the sample was 10 mm; the film thickness was about 10 μm; and the distance between chucks was made to be 20 mm. The tension rate was set at 5 mm/min; and the measurement temperature was made nearly at room temperature (20° C. to 25° C.). Averages of measurement values of 5 or more test pieces obtained from the cured film obtained in the same condition were taken as the elongation at break after being left at a high temperature and the elastic modulus after being left at a high temperature. It is preferable that the elongation at break after being left at a high temperature is large; and it is more preferable that the elongation is 5% or larger. It is preferable that the elastic modulus after being left at a high temperature is low; and it is preferable that the elastic modulus is 3 GPa or lower. It is preferable that the difference between the elongation at break after being left at a high temperature and the elongation at break after the curing is smaller. It is also preferable that the difference between the elastic modulus after being left at a high temperature and the elastic modulus after the curing is smaller. The results are shown in Table 2.

(Elongation at Break after a Thermal Shock Test, Elastic Modulus after a Thermal Shock Test)

A cured film of about 10 μm in film thickness obtained by the same method as in the above-mentioned evaluation of the curing shrinkage percentage was subjected to a thermal shock test of 1000 cycles with each cycle being −40° C./30 min to 125° C./30 min by using an ETAC WINTECH NT1010 (made by Kusumoto Chemicals, Ltd.), and thereafter peeled off the silicon substrate; and the elongation at break and the elastic modulus of the peeled-off cured film were measured by Autograph AGS-H100N, made by Shimadzu Corp. The width of the sample was 10 mm; the film thickness was about 10 μm; and the distance between chucks was made to be 20 mm. The tension rate was set at 5 mm/min; and the measurement temperature was made nearly at room temperature (20° C. to 25° C.). Averages of measurement values of 5 test pieces obtained from the cured film obtained in the same condition were taken as the elongation at break after a thermal shock test and the elastic modulus after a thermal shock test. It is preferable that the elongation at break after a thermal shock test is large; and it is more preferable that the elongation is 5% or larger. It is preferable that the elastic modulus after a thermal shock test is low; and it is preferable that the elastic modulus is 3 GPa or lower. It is also preferable that the difference between the elongation at break after a thermal shock test and the elongation at break after the curing is smaller. It is also preferable that the difference between the elastic modulus after a thermal shock test and the elastic modulus after the curing is smaller. The results are shown in Table 2.

(White Turbidity of the Resin)

The photosensitive resin compositions obtained in Examples 1 to 12 and Comparative Examples 1 to 3 were visually observed, and if the resin was transparent, it was taken as A; when being slightly cloudy, as B; and when being heavily cloudy, as C. If the white turbidity of the resin is A or B, when a semiconductor element having a patterned cured film formed by using the resin is produced, marks for alignment made on a substrate can be recognized. The results are shown in Table 2.

(Haze)

The photosensitive resin compositions obtained in Examples 1 to 12 and Comparative Examples 1 to 3 were each spin coated on a glass substrate, heated at 120° C. for 3 min to thereby form a coated film of 10 to 11 μm in film thickness; and the haze value (haze after the coating) of the film was measured by a haze meter (made by Nippon Denshoku Industries Co., Ltd., trade name: "NDH5000"). The haze value is a numerical value indicating a degree of cloudiness, and refers to a proportion of the diffusion light to the total reflection light. The calculation expression of the haze value is as follows.

Haze=a diffusion rate/a total light transmittance×100

It is preferable that the haze value is lower than 7.0%; lower than 5.0% is more preferable; lower than 1.0% is still more preferable. If the haze value is 7.0% or higher, when a semiconductor element is produced, marks for alignment made on a substrate can hardly be recognized. The results are shown in Table 2.

TABLE 2

| Com-ponent | Material | Example | | | | | | | | | | | | Comparative Example | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 | 3 |
| (A) | A1 | 80 | 80 | 80 | 80 | 80 | 80 | 80 | — | — | 80 | 80 | 80 | 100 | — | 80 |
| | A2 | — | — | — | — | — | — | — | 80 | — | — | — | — | — | — | — |
| | A3 | — | — | — | — | — | — | — | — | 80 | — | — | — | — | — | — |
| | A4 | — | — | — | — | — | — | — | — | — | — | — | — | — | 80 | — |
| (B) | B1 | 20 | 20 | 20 | 20 | 20 | 20 | 20 | 20 | 20 | — | 20 | 20 | 20 | 15 | 20 |
| | B2 | — | — | — | — | — | — | — | — | — | 20 | — | — | — | — | — |
| (C) | C1 | 5 | 5 | 5 | 5 | 5 | 5 | 5 | 5 | 5 | 5 | — | 5 | 5 | 15 | 5 |
| | C2 | — | — | — | — | — | — | — | — | — | — | 5 | — | — | — | — |
| (D) | D1 | 20 | — | — | — | — | — | — | 20 | 20 | 20 | 20 | — | — | 20 | — |
| | D2 | — | 20 | — | — | — | — | — | — | — | — | — | — | — | — | — |
| | D3 | — | — | 20 | — | — | — | — | — | — | — | — | — | — | — | — |
| | D4 | — | — | — | 20 | — | — | — | — | — | — | — | — | — | — | — |
| | D'5 | — | — | — | — | — | — | — | — | — | — | — | — | — | — | 20 |

TABLE 2-continued

| Component | Material | 1 | 2 | 3 | 4 | 5 | 6 | 7 | 8 | 9 | 10 | 11 | 12 | CE 1 | CE 2 | CE 3 |
|---|---|---|---|---|---|---|---|---|---|---|---|---|---|---|---|---|
| | D6 | — | — | — | — | 20 | — | — | — | — | — | — | — | — | — | — |
| | D7 | — | — | — | — | — | 20 | — | — | — | — | — | — | — | — | — |
| | D8 | — | — | — | — | — | — | 20 | — | — | — | — | — | — | — | — |
| | D9 | — | — | — | — | — | — | — | — | — | — | — | 20 | — | — | — |
| Remaining Film Ratio (%) | | 97 | 94 | 90 | 82 | 98 | 90 | 93 | 75 | 95 | 92 | 95 | 100 | 99 | 99 | 93 |
| Sensitivity [mJ/cm$^2$] | | 460 | 440 | 420 | 660 | ≥1520 | 440 | 420 | 280 | 560 | 600 | 520 | 320 | no opening made | 400 | 460 |
| Resolution [μm] | After Development | 2 | 2 | 2 | 5 | — | 2 | 2 | 2 | 2 | 3 | 3 | 10 | — | 5 | 2 |
| | After Curing | 2 | 2 | 2 | 5 | — | 2 | 2 | 2 | 2 | 3 | 3 | 10 | — | 15 | 2 |
| Curing Shrinkage Percentage [%] | | 10 | 10 | 10 | 10 | 9 | 10 | 10 | 10 | 12 | 10 | 12 | 10 | 10 | 14 | 10 |
| Elongation at Break [%] | After Curing | 55 | 49 | 52 | 38 | 19 | 29 | 20 | 23 | 18 | 28 | 13 | 28 | 4 | 40 | 8 |
| | After Being Left at a High Temperature | 40 | 36 | 38 | 24 | 16 | 22 | 15 | 16 | 15 | 19 | 7 | 20 | 3 | 10 | 4 |
| | After Thermal Shock | 42 | 39 | 40 | 26 | 16 | 23 | 15 | 18 | 15 | 21 | 10 | 20 | 3 | 17 | 5 |
| Elastic Modulus [GPa] | Test After Curing | 2.4 | 2.2 | 2.0 | 1.9 | 2.3 | 2.4 | 2.5 | 2.4 | 2.2 | 2.5 | 2.6 | 2.7 | 3.6 | 2.1 | 2.7 |
| | After Being Left at a High Temperature | 2.5 | 2.3 | 2.1 | 2.0 | 2.4 | 2.5 | 2.6 | 2.6 | 2.3 | 2.6 | 2.7 | 2.8 | 3.7 | 2.7 | 2.9 |
| | After Thermal Shock Test | 2.4 | 2.2 | 2.0 | 1.9 | 2.3 | 2.4 | 2.5 | 2.5 | 2.2 | 2.5 | 2.6 | 2.8 | 3.7 | 2.6 | 2.8 |
| White Turbidity | | A | A | A | A | A | A | B | A | A | A | A | A | A | A | C |
| Haze [%] | | 0.3 | 0.3 | 0.4 | 0.5 | 0.4 | 0.4 | 1.2 | 0.5 | 0.5 | 0.6 | 0.5 | 0.3 | 0.2 | 2 | 15.6 |

As is clear from Table 2, the photosensitive resin compositions of Examples 1 to 12 were good in the sensitivity, could sufficiently suppress white turbidity, were excellent in the mechanical properties (elongation at break and elastic modulus) of the formed patterned cured films, and were low in the changing rates of the mechanical properties after being left at a high temperature and after a thermal shock test. By contrast, in Comparative Example 1, in which no (D) component was used, the mechanical properties of the formed patterned cured film were inferior. In Comparative Example 2, in which a cresol novolac resin A'4 was used, the changing rates of the mechanical properties after being left at a high temperature and after a thermal shock test became high. Further in Comparative Example 3, in which an acryl resin D'5 having no structural unit represented by the formula (2) was used, the resin became cloudy, and also the haze value of the formed patterned cured film was high.

[(D) Component]
D10: 55 g of ethyl lactate was weighed in a 100-ml three-necked flask equipped with a stirrer, a nitrogen introducing tube and a thermometer; and separately weighed polymerizable monomers (35.44 g of n-butyl acrylate (BA), 2.17 g of lauryl acrylate (LA), 3.91 g of acrylic acid (AA), 2.61 g of hydroxybutyl acrylate (HBA) and 0.87 g of 1,2,2,6,6-pentamethylpiperidin-4-yl methacrylate (trade name: FA-711MM, made by Hitachi Chemical Co., Ltd.)), and 0.30 g of azobisisobutyronitrile (AIBN) were added. While the mixture was stirred at room temperature at a stirring rotation frequency of about 160 rpm, nitrogen gas was made to flow at a flow volume of 400 ml/min for 30 min to thereby remove dissolved oxygen. Thereafter, the inflow of the nitrogen gas was stopped; the flask was sealed; and the reaction solution was heated up to 65° C. in about 25 min in a constant-temperature water bath. The polymerization reaction was carried out with the temperature being held for 10 hours, to thereby obtain an acryl resin D10. The polymerization rate at this time was 99%. The weight-average molecular weight of the D10 as measured by the above-mentioned method was about 28000.

The molecular ratio of the polymerizable monomers in the acryl resin D10 was as follows.
BA/LA/AA/HBA/FA711MM=76.5/2.5/15/5/1 (mol %)
[(E) Component]
E1: 1,1-bis(4-hydroxyphenyl)-1-[4-{1-(4-hydroxyphenyl)-1-methylethyl}phenyl]ethane (made by Honshu Chemical Industry Co., Ltd., trade name: "TrsP-PA-MF", a compound corresponding to the formula (14)).
E2: 1,1,1-tris(4-hydroxyphenyl)methane (a compound corresponding to the formula (13)).
E3: 1-(3-methyl-4-hydroxyphenyl)-4-(4-hydroxyphenyl)benzene (a compound corresponding to the formula (15)).

Examples 13 to 25, and Comparative Examples 4 and 5

(A) to (E) components in blend amounts indicated in Table 3, 120 parts by mass of ethyl lactate as a solvent, and 2 parts by mass of a 50% methanol solution of ureapropyltriethoxysilane as a coupling agent were blended. The obtained blend was subjected to a pressure filtration using a Teflon® filter of 3 μm in pore to thereby prepare photosensitive resin compositions of Examples 13 to 25 and Comparative Examples 4 and 5.
<Evaluation of the Photosensitive Resin Compositions>
The photosensitive resin compositions of Examples 13 to 25 and Comparative Examples 4 and 5 were evaluated for the following. The results are shown in Table 3.
(Remaining film ratio, sensitivity, resolution, curing shrinkage percentage, elongation at break after curing, elastic modulus after curing, elongation at break after being left at a high temperature, elastic modulus after being left at a high temperature, elongation at break after a thermal shock test, elastic modulus after a thermal shock test, white turbidity of the resin, haze)
These items were evaluated by the same means as described above.
(Residue)
For the square hole patterns of 10 μm×10 μm among the above-mentioned square hole patterns of from 1 μm×1 μm to 100 μm×100 μm, the presence/absence of the residue at openings was observed using SEM. The case where the residue was less than 0.5 μm from the end surface of the opening was taken as A; the case where being 0.5 μm or more and less than 1.0 μm was taken as B; and the case where being 1.0 μm or more was taken as C.

TABLE 3

| Com-ponent | Material | Example | | | | | | | | | | | | | Comparative Example | |
|---|---|---|---|---|---|---|---|---|---|---|---|---|---|---|---|---|
| | | 13 | 14 | 15 | 16 | 17 | 18 | 19 | 20 | 21 | 22 | 23 | 24 | 25 | 4 | 5 |
| (A) | A1 | 80 | 80 | 80 | 80 | 80 | — | 80 | 80 | 80 | — | 80 | 80 | — | 80 | — |
| | A2 | — | — | — | — | — | — | — | — | — | 80 | — | — | 80 | — | — |
| | A3 | — | — | — | — | — | 80 | — | — | — | — | — | — | — | — | 80 |
| (B) | B1 | 20 | 20 | 20 | 20 | 20 | 20 | — | 20 | 20 | 20 | 20 | 20 | 20 | 20 | 20 |
| | B2 | — | — | — | — | — | — | 20 | — | — | — | — | — | — | — | — |
| (C) | C1 | 5 | 5 | 5 | 5 | 5 | 5 | 5 | — | 5 | 5 | 5 | 5 | 5 | 5 | 5 |
| | C2 | — | — | — | — | — | — | — | 5 | — | — | — | — | — | — | — |
| (D) | D1 | 15 | 15 | 15 | 15 | 15 | 15 | 15 | 15 | — | 15 | 15 | — | — | — | — |
| | D10 | — | — | — | — | — | — | — | — | 15 | — | — | 15 | 15 | — | — |
| (E) | E1 | 2.5 | 5 | 7.5 | — | — | 5 | 5 | 5 | 5 | — | — | — | — | 2.5 | 5 |
| | E2 | — | — | — | 5 | — | — | — | — | — | 5 | — | — | — | — | — |
| | E3 | — | — | — | — | 5 | — | — | — | — | — | — | — | — | — | — |
| Remaining Film Ratio [%] | | 96 | 96 | 94 | 95 | 95 | 93 | 90 | 92 | 97 | 74 | 97 | 98 | 80 | 99 | 96 |
| Sensitivity [mJ/cm²] | | 460 | 420 | 380 | 440 | 460 | 480 | 520 | 580 | 520 | 260 | 500 | 600 | 340 | no opening made | no opening made |
| Resolution [μm] | After Development | 2 | 2 | 2 | 2 | 2 | 2 | 3 | 3 | 2 | 2 | 3 | 5 | 5 | — | — |
| | After Curing | 2 | 2 | 2 | 2 | 2 | 2 | 3 | 3 | 2 | 2 | 3 | 5 | 5 | — | — |
| Curing Shrinkage Percentage [%] | | 10 | 10 | 10 | 10 | 10 | 12 | 10 | 12 | 10 | 10 | 10 | 10 | 10 | 10 | 10 |
| Elongation at Break [%] | After Curing | 55 | 55 | 55 | 55 | 55 | 18 | 26 | 13 | 42 | 24 | 55 | 38 | 18 | 5 | 4 |
| | After Being Left at a High Temperature | 40 | 39 | 40 | 39 | 39 | 15 | 18 | 8 | 33 | 16 | 40 | 30 | 13 | 4 | 3 |
| | After Thermal Shock | 41 | 41 | 40 | 40 | 39 | 15 | 19 | 10 | 34 | 17 | 41 | 29 | 14 | 3 | 3 |
| Elastic Modulus [GPs] | Test After Curing | 2.5 | 2.5 | 2.5 | 2.5 | 2.5 | 2.3 | 2.6 | 2.7 | 2.2 | 2.5 | 2.5 | 2.2 | 2.3 | 3.6 | 3.2 |
| | After Being Left at a High Temperature | 2.6 | 2.6 | 2.6 | 2.6 | 2.6 | 2.4 | 2.7 | 2.8 | 2.3 | 2.6 | 2.6 | 2.3 | 2.4 | 3.7 | 3.3 |
| | After Thermal Shock Test | 2.5 | 2.5 | 2.5 | 2.5 | 2.5 | 2.3 | 2.6 | 2.7 | 2.2 | 2.5 | 2.5 | 2.2 | 2.3 | 3.7 | 3.2 |
| White Turbidity | | A | A | A | A | A | A | A | A | A | A | A | A | A | A | A |
| Haze [%] | | 0.3 | 0.3 | 0.4 | 0.3 | 0.3 | 0.5 | 0.6 | 0.5 | 0.6 | 0.5 | 0.3 | 0.6 | 0.7 | 0.2 | 0.4 |
| Residue | | A | A | A | A | A | A | A | A | A | A | B | C | C | — | — |

As is clear from Table 3, the photosensitive resin compositions of Examples 13 to 25 were good in the sensitivity, could sufficiently suppress white turbidity, were excellent in the mechanical properties (elongation at break and elastic modulus) of the formed patterned cured films, and were low in the changing rates of the mechanical properties after being left at a high temperature and after a thermal shock test. Particularly it is clear that Examples 13 to 22, in which the (C) component contained a thermal crosslinking agent having an alkoxymethyl group and used an (E) component had the excellent dissolution contrast between exposed portions and unexposed portions. By contrast, in Comparative Examples 4 and 5, in which no (D) component was used, the sensitivity decreased and the square hole patterns of 100 μm×100 μm could not be formed.

REFERENCE SIGNS LIST

1 . . . SEMICONDUCTOR SUBSTRATE, 2 . . . PROTECTING FILM, 3 . . . FIRST CONDUCTOR LAYER, 4 . . . INTERLAYER INSULATING LAYER, 5 . . . PHOTOSENSITIVE RESIN LAYER, 6A, 6B, 6C . . . WINDOW PART, 7 . . . SECOND CONDUCTOR LAYER, 8 . . . SURFACE PROTECTING LAYER, 11 . . . INTERLAYER INSULATING LAYER, 12 . . . WIRING LAYER, 13 . . . INSULATING LAYER, 14 . . . SURFACE PROTECTING LAYER, 15 . . . PAD PART, REWIRING LAYER, 17 . . . CONDUCTIVE BALL, 18 . . . CORE, COVER COAT LAYER, 20 . . . BARRIER METAL, 21 . . . COLLAR, 22 . . . UNDERFILL, 23 . . . SILICON SUBSTRATE, 24 . . . CONNECTION PART, 100, 200, 300, 400 . . . STRUCTURAL BODY, and 500, 600, 700 . . . SEMICONDUCTOR ELEMENT

The invention claimed is:
1. A photosensitive resin composition, comprising:
(A) an alkali-soluble resin having a structural unit represented by the following formula (1):

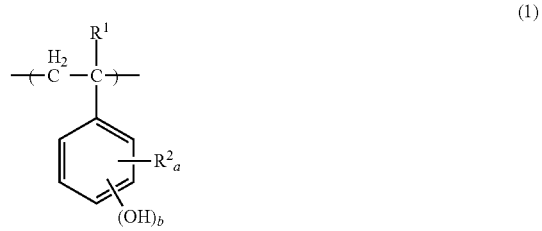

wherein $R^1$ represents a hydrogen atom or a methyl group; $R^2$ represents an alkyl group having 1 to 10 carbon atoms, an aryl group having 6 to 10 carbon atoms or an alkoxy group having 1 to 10 carbon atoms; and a represents an integer of 0 to 3, b represents an integer of 1 to 3, and a total of a and b is 5 or less;
(B) a compound that generates an acid by light;
(C) a thermal crosslinking agent; and (D) an acryl resin having a structural unit represented by the following formula (2) and a structural unit represented by the following formula (3):

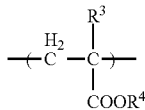
(2)

wherein $R^3$ represents a hydrogen atom or a methyl group; and $R^4$ represents a hydroxyalkyl group having 2 to 20 carbon atoms;

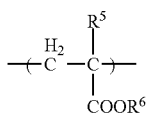
(3)

wherein $R^5$ represents a hydrogen atom or a methyl group; and $R^6$ represents a monovalent organic group having a primary, secondary or tertiary amino group wherein the photosensitive resin has a haze value of less than 7%.

2. The photosensitive resin composition according to claim 1, wherein the (D) component is the acryl resin further having a structural unit represented by the following formula (4):

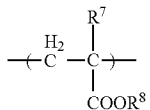
(4)

wherein $R^7$ represents a hydrogen atom or a methyl group; and $R^8$ represents an alkyl group having 4 to 20 carbon atoms.

3. The photosensitive resin composition according to claim 1, wherein the (D) component is the acryl resin further having a structural unit represented by the following formula (5):

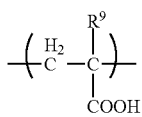
(5)

wherein $R^9$ represents a hydrogen atom or a methyl group.

4. The photosensitive resin composition according to claim 1, wherein the (A) component is the alkali-soluble resin further having a structural unit represented by the following formula (6):

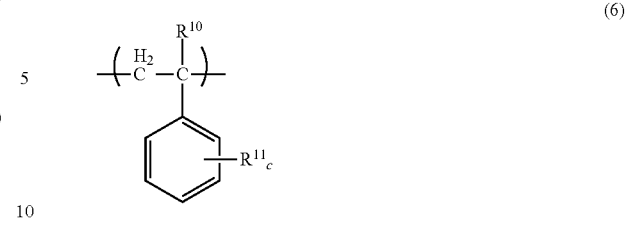
(6)

wherein $R^{10}$ represents a hydrogen atom or a methyl group; $R^{11}$ represents an alkyl group having 1 to 10 carbon atoms, an aryl group having 6 to 10 carbon atoms or an alkoxy group having 1 to 10 carbon atoms; and c represents an integer of 0 to 3.

5. The photosensitive resin composition according to claim 1, wherein the (A) component is the alkali-soluble resin further having a structural unit represented by the following formula (7):

(7)

wherein $R^{12}$ represents a hydrogen atom or a methyl group; and $R^{13}$ represents an alkyl group having 1 to 10 carbon atoms or a hydroxyalkyl group having 1 to 10 carbon atoms.

6. The photosensitive resin composition according to claim 1, wherein the (B) component is an o-quinone diazide compound.

7. The photosensitive resin composition according to claim 1, wherein the (C) component comprises a thermal crosslinking agent having an alkoxymethyl group; and the photosensitive resin composition further comprises (E) a phenolic low molecular weight compound.

8. The photosensitive resin composition according to claim 7, wherein the (E) component is a phenolic low molecular weight compound represented by the following formula (13), (14) or (15):

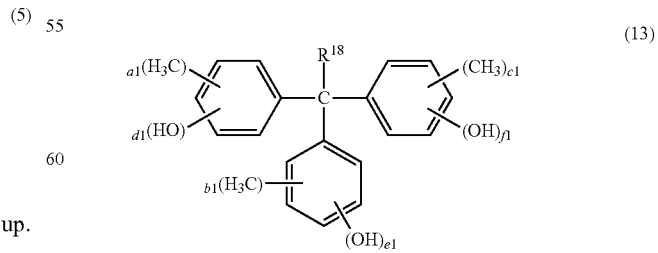
(13)

wherein $R^{18}$ represents a hydrogen atom or a methyl group; and a1 to f1 represent an integer of 0 to 3, a total of d1 to f1 is 1 or more, a total of a1 and d1 is 5 or less, a total of b1 and e1 is 5 or less, and a total of c1 and f1 is 5 or less;

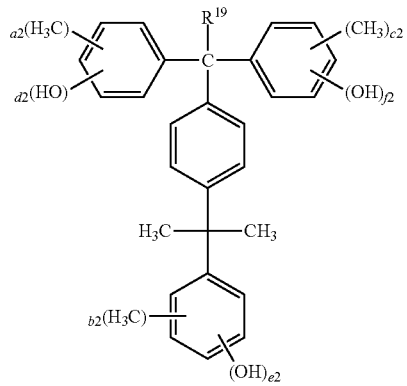

(14)

wherein $R^{19}$ represents a hydrogen atom or a methyl group; and a2 to c2 represent an integer of 0 to 3, d2 to f2 represent an integer of 1 to 3, a total of a2 and d2 is 5 or less, a total of b2 and e2 is 5 or less, and a total of c2 and f2 is 5 or less; or

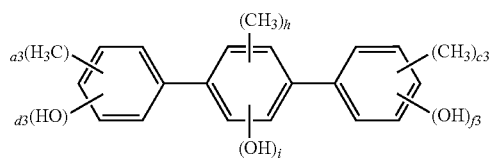

(15)

wherein a3, c3, h and i represent an integer of 0 to 3, d3 and f3 represent an integer of 1 to 3, a total of a3 and d3 is 5 or less, a total of c3 and f3 is 5 or less, and a total of h and i is 4 or less.

9. A patterned cured film, being obtained by heating the photosensitive resin composition according to claim 1.

10. A method for producing a patterned cured film, comprising:
a step of applying and drying the photosensitive resin composition according to claim 1 on a part or the whole of a substrate to thereby form a resin film;
a step of exposing a part or the whole of the resin film;
a step of developing the resin film after the exposure with an alkali aqueous solution to thereby form a patterned resin film; and
a step of heating the patterned resin film.

11. A semiconductor element, having a patterned cured film formed by the method for producing a patterned cured film according to claim 10, as an interlayer insulating layer.

12. A semiconductor element, having a patterned cured film formed by the method for producing a patterned cured film according to claim 10, as a surface protecting layer.

13. An electronic device, comprising the semiconductor element according to claim 11.

14. A photosensitive resin composition, comprising:
(A) an alkali-soluble resin having a structural unit represented by the following formula (1):

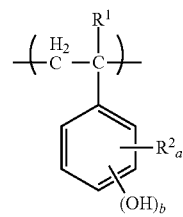

(1)

wherein $R^1$ represents a hydrogen atom or a methyl group; $R^2$ represents an alkyl group having 1 to 10 carbon atoms, an aryl group having 6 to 10 carbon atoms or an alkoxy group having 1 to 10 carbon atoms; and a represents an integer of 0 to 3, b represents an integer of 1 to 3, and a total of a and b is 5 or less;
(B) a compound that generates an acid by light;
(C) a thermal crosslinking agent; and
(D) an acryl resin having a structural unit represented by the following formula (2) and a structural unit represented by the following formula (4):

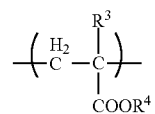

(2)

wherein $R^3$ represents a hydrogen atom or a methyl group; and $R^4$ represents a hydroxyalkyl group having 2 to 20 carbon atoms;

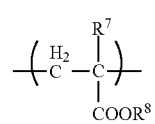

(4)

wherein $R^7$ represents a hydrogen atom or a methyl group; and $R^8$ represents an alkyl group having 4 to 20 carbon atoms wherein the photosensitive resin has a haze value of less than 7%.

15. The photosensitive resin composition according to claim 14, wherein the (D) component is the acryl resin further having a structural unit represented by the following formula (5):

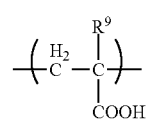

(5)

wherein $R^9$ represents a hydrogen atom or a methyl group.

16. The photosensitive resin composition according to claim 14, wherein the (A) component is the alkali-soluble resin further having a structural unit represented by the following formula (6):

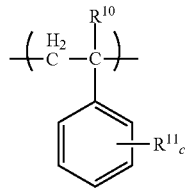

(6)

wherein $R^{10}$ represents a hydrogen atom or a methyl group; $R^{11}$ represents an alkyl group having 1 to 10 carbon atoms, an aryl group having 6 to 10 carbon atoms or an alkoxy group having 1 to 10 carbon atoms; and c represents an integer of 0 to 3.

17. The photosensitive resin composition according to claim 14, wherein the (A) component is the alkali-soluble resin further having a structural unit represented by the following formula (7):

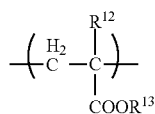

(7)

wherein $R^{12}$ represents a hydrogen atom or a methyl group; and $R^{13}$ represents an alkyl group having 1 to 10 carbon atoms or a hydroxyalkyl group having 1 to 10 carbon atoms.

18. The photosensitive resin composition according to claim 14, wherein the (B) component is an o-quinone diazide compound.

19. The photosensitive resin composition according to claim 14, wherein the (C) component comprises a thermal crosslinking agent having an alkoxymethyl group; and the photosensitive resin composition further comprises (E) a phenolic low molecular weight compound.

20. The photosensitive resin composition according to claim 19, wherein the (E) component is a phenolic low molecular weight compound represented by the following formula (13), (14) or (15):

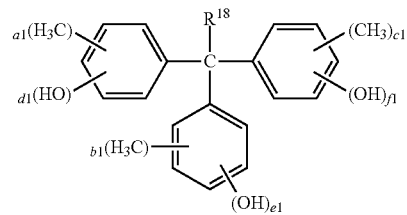

(13)

wherein $R^{18}$ represents a hydrogen atom or a methyl group; and a1 to f1 represent an integer of 0 to 3, a total of d1 to f1 is 1 or more, a total of a1 and d1 is 5 or less, a total of b1 and e1 is 5 or less, and a total of c1 and f1 is 5 or less;

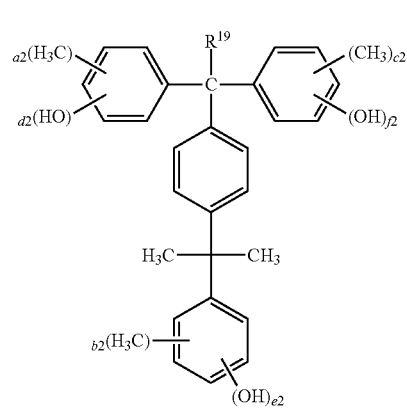

(14)

wherein $R^{19}$ represents a hydrogen atom or a methyl group; and a2 to c2 represent an integer of 0 to 3, d2 to f2 represent an integer of 1 to 3, a total of a2 and d2 is 5 or less, a total of b2 and e2 is 5 or less, and a total of c2 and f2 is 5 or less; or

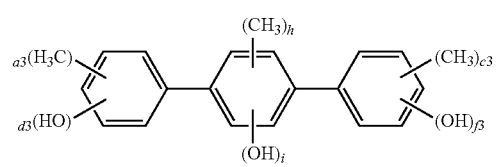

(15)

wherein a3, c3, h and i represent an integer of 0 to 3, d3 and f3 represent an integer of 1 to 3, a total of a3 and d3 is 5 or less, a total of c3 and f3 is 5 or less, and a total of h and i is 4 or less.

* * * * *